United States Patent
Bhanap et al.

(10) Patent No.: US 7,678,712 B2
(45) Date of Patent: Mar. 16, 2010

(54) VAPOR PHASE TREATMENT OF DIELECTRIC MATERIALS

(75) Inventors: Anil S. Bhanap, Milpitas, CA (US);
Robert R. Roth, Sunnyvale, CA (US);
Kikue S. Burnham, San Ramon, CA (US); Brian J. Daniels, La Honda, CA (US); Denis H. Endisch, Cupertino, CA (US); Ilan Golecki, Parsippany, NJ (US)

(73) Assignee: Honeywell International, Inc., Morristown, NJ (US)

(*) Notice: Subject to any disclaimer, the term of this patent is extended or adjusted under 35 U.S.C. 154(b) by 187 days.

(21) Appl. No.: 11/086,010

(22) Filed: Mar. 22, 2005

(65) Prior Publication Data

US 2006/0216952 A1    Sep. 28, 2006

(51) Int. Cl.
*H01L 21/31* (2006.01)
(52) U.S. Cl. .................. 438/787; 438/781; 438/790; 438/4; 257/E21.243
(58) Field of Classification Search ................ 438/787, 438/790, 781, 4
See application file for complete search history.

(56) References Cited

U.S. PATENT DOCUMENTS

| | | | |
|---|---|---|---|
| 4,567,221 A | 1/1986 | Maruyama et al. | 542/436 |
| 4,624,739 A | 11/1986 | Nixon et al. | 438/723 |
| 4,654,269 A | 3/1987 | Lehrer | 428/428 |
| 5,079,300 A | 1/1992 | Dubrow et al. | 525/106 |
| 5,271,777 A | 12/1993 | Duffy | 148/537 |
| 5,429,730 A | 7/1995 | Nakamura et al. | 204/192.34 |
| 5,479,727 A | 1/1996 | Fine et al. | 34/516 |
| 5,576,247 A | 11/1996 | Yano et al. | 438/760 |
| 5,686,549 A | 11/1997 | Grainger et al. | 528/25 |
| 5,750,610 A | 5/1998 | Burns et al. | 524/434 |
| 5,915,175 A | 6/1999 | Wise | 438/238 |
| 6,037,275 A | 3/2000 | Wu et al. | 438/780 |
| 6,042,994 A | 3/2000 | Yang et al. | 430/296 |
| 6,090,724 A | 7/2000 | Shelton et al. | |
| 6,177,143 B1 | 1/2001 | Treadwell et al. | 427/515 |
| 6,208,014 B1 | 3/2001 | Wu et al. | 257/629 |

(Continued)

FOREIGN PATENT DOCUMENTS

DE    10130824    10/2002

(Continued)

OTHER PUBLICATIONS

S.V. Nitta, et al., "Surface Modified Spin-On Xerogel Films as Interlayer Dielectrics", 1999 American Vacuum Society, pp. 205-212.

(Continued)

*Primary Examiner*—Alexander G Ghyka
(74) *Attorney, Agent, or Firm*—Richard S. Roberts; Roberts & Roberts, L.L.P.

(57) ABSTRACT

The invention concerns a method for applying a surface modification agent composition for organosilicate glass dielectric films. More particularly, the invention pertains to a method for treating a silicate or organosilicate dielectric film on a substrate, which film either comprises silanol moieties or has had at least some previously present carbon containing moieties removed therefrom. The treatment adds carbon containing moieties to the film and/or seals surface pores of the film, when the film is porous.

36 Claims, 3 Drawing Sheets

System Configuration C

U.S. PATENT DOCUMENTS

| | | | |
|---|---|---|---|
| 6,255,230 B1 | 7/2001 | Ikakura et al. | 438/765 |
| 6,258,972 B1 | 7/2001 | Nakaoka et al. | 556/482 |
| 6,318,124 B1 | 11/2001 | Rutherford et al. | 65/60.8 |
| 6,346,490 B1 | 2/2002 | Catabay et al. | 438/795 |
| 6,395,650 B1 | 5/2002 | Callegari et al. | 438/785 |
| 6,395,651 B1 | 5/2002 | Smith et al. | |
| 6,410,149 B1 | 6/2002 | Hendricks et al. | 428/447 |
| 6,420,193 B1 | 7/2002 | Martin | 438/4 |
| 6,448,331 B1 | 9/2002 | Ioka et al. | |
| 6,451,512 B1 | 9/2002 | Rangarajan | 430/313 |
| 6,479,374 B1 | 11/2002 | Ioka et al. | 438/601 |
| 6,495,906 B2 | 12/2002 | Smith et al. | 257/629 |
| 6,508,920 B1 | 1/2003 | Ritzdorf | 204/194 |
| 6,518,205 B1 | 2/2003 | Wu et al. | 438/782 |
| 6,521,547 B1 | 2/2003 | Chang et al. | 438/781 |
| 6,537,919 B1 | 3/2003 | Wang | 438/710 |
| 6,566,283 B1 | 5/2003 | Pangrle et al. | 438/788 |
| 6,573,147 B2 | 6/2003 | Moon et al. | 438/348 |
| 6,583,067 B2 | 6/2003 | Chang et al. | 438/723 |
| 6,589,889 B2 | 7/2003 | Endisch et al. | 438/780 |
| 6,607,925 B1 | 8/2003 | Kim et al. | 438/4 |
| 6,713,382 B1 | 3/2004 | Pangrle et al. | 438/622 |
| 6,743,737 B2 | 6/2004 | Yau et al. | 438/758 |
| 6,762,066 B2 | 7/2004 | Holz | 438/4 |
| 6,770,572 B1 | 8/2004 | Wu et al. | 438/778 |
| 6,821,880 B1 | 11/2004 | Tao et al. | 438/618 |
| 7,029,826 B2 | 4/2006 | Hacker et al. | 430/311 |
| 2002/0001973 A1 | 1/2002 | Wu et al. | 438/780 |
| 2002/0168876 A1 | 11/2002 | Endisch et al. | |
| 2003/0003765 A1 | 1/2003 | Gibson et al. | |
| 2003/0013211 A1 | 1/2003 | Hu et al. | 438/4 |
| 2003/0198895 A1 | 10/2003 | Toma et al. | 430/314 |
| 2004/0013858 A1 | 1/2004 | Hacker et al. | 428/195.1 |
| 2004/0072436 A1 | 4/2004 | RamachandraRao et al. | 438/692 |
| 2004/0079632 A1 | 4/2004 | Ahmad et al. | 204/192.3 |
| 2004/0096593 A1 | 5/2004 | Lukas et al. | 427/558 |
| 2004/0096672 A1 | 5/2004 | Lukas et al. | 428/446 |
| 2004/0152296 A1 | 8/2004 | Matz et al. | 428/623 |
| 2004/0224095 A1 | 11/2004 | Miller | 427/402 |
| 2004/0224512 A1 | 11/2004 | Sato et al. | 438/689 |
| 2005/0017365 A1 | 1/2005 | RamachandraRao et al. | 257/758 |
| 2005/0032293 A1 | 2/2005 | Clark et al. | 438/222 |
| 2005/0077597 A1 | 4/2005 | Toma et al. | 257/629 |
| 2005/0095840 A1 | 5/2005 | Bhanap et al. | 438/623 |
| 2005/0106341 A1 | 5/2005 | Sambasivan et al. | 428/337 |
| 2005/0106762 A1 | 5/2005 | Chakrapani et al. | |
| 2005/0158884 A1 | 7/2005 | Gaynor | 438/4 |
| 2005/0173803 A1 | 8/2005 | Lu et al. | 257/759 |
| 2005/0215072 A1 | 9/2005 | Kevwitch et al. | 438/778 |
| 2005/0229947 A1 | 10/2005 | Spiegelman et al. | 134/2 |
| 2005/0233583 A1 | 10/2005 | Miyajima | 438/672 |
| 2005/0282401 A1 | 12/2005 | Davis | 438/780 |
| 2006/0057837 A1 | 3/2006 | Bhanap et al. | 438/623 |
| 2006/0057855 A1 | 3/2006 | Ramos et al. | 438/710 |
| 2006/0078827 A1 | 4/2006 | Hacker et al. | 430/311 |
| 2006/0141641 A1 | 6/2006 | Fan et al. | 438/4 |

FOREIGN PATENT DOCUMENTS

| | | |
|---|---|---|
| EP | 0643421 | 3/1995 |
| EP | 0688052 | 12/1995 |
| EP | 0775669 | 5/1997 |
| EP | 0 849 796 | 6/1998 |
| EP | 0997497 | 10/2004 |
| JP | 06-067408 | 3/1994 |
| JP | 07-335758 | 12/1995 |
| JP | 09-106983 | 4/1997 |
| JP | 09-237833 | 9/1997 |
| KR | 2001-0001970 | 4/2002 |
| RU | 2089499 | 9/1997 |
| TW | 483099 | 4/2002 |
| TW | 495880 | 7/2002 |
| WO | WO 9738355 | 10/1997 |
| WO | WO 99/03926 | 1/1999 |
| WO | WO 99/52136 | 10/1999 |
| WO | WO 00/02233 | 1/2000 |
| WO | WO 00/44036 A | 7/2000 |
| WO | WO 02/01621 * | 1/2002 |
| WO | WO 02/01621 A | 1/2002 |
| WO | WO 0201621 | 1/2002 |
| WO | WO 03/077296 A | 9/2003 |
| WO | WO2004068555 | 8/2004 |
| WO | WO 2005/010972 A | 2/2005 |
| WO | WO 2005/034194 A | 4/2005 |
| WO | WO 2005/038863 | 4/2005 |

OTHER PUBLICATIONS

Patent Abstracts of Japan, vol. 2003, No. 09, Sep. 3, 2003-& JP 2003 142476 A (Asahi Kasei Corp), May 16, 2003 Hexamethylcyclosilizane as agent par. 79 abstract.

Abell, T. et. al.: "Damage minimized plasma pore sealing of microporous low k dielectrics" Microelectronic Engineering, Elsevier Publishers Bv., Amsterdam, NL, vol. 76, No. 1-4, Oct. 2004, pp. 16-19, XP004565763, ISSN: 0167-9317, the whole document.

"Fabrication of Moisture-Desensitized Freestanding Structures from InP for Photonic-MEMS Applications." Shah, Mithilesh A., et al. Journal of the Electrochemical Society, vol. 153, Issue 1, pp. G7-G11 (2006).

"Observation of intrusion rates of hexamethyldisilazane during supercritical carbon dioxide functionalization of triethoxyfluorosilane low-k films." Capani, P. M., et al., Materials Research Society Symposium Proceedings (2005), 863(Materials, Technology and Reliability of Advanced Interconnects—2005), pp. 177-182.

"Dielectric and Mechanical Properties of Surface Modified Organosilicate Films." Yu, Suzhu, et al., Journal of Sol-Gel Science and Technology (2005), 35(1), pp. 69-75.

"Repair of porous MSQ (p-MSQ) films using monochlorosilanes dissolved in supercritical CO2." Xie, Bo, et al., Diffusion and Defect Data—Solid State Data, Pt. B: Solid State Phenomena (2005), 103-104(Ultra Clean Processing of Silicon Surfaces VII), pp. 323-326.

"Non-damaging cleaning processes for porous low-k materials." Clark, Philip G., et al. Advanced Metallization Conference 2004, Proceedings of the Conference, San Diego, (2005), 487-491. Publisher: Materials Research Society.

"The reaction of octyldimethylchlorosilane and supercritical CO2 mixtures with porous methylsilsesquioxane thin films." Xie, Bo, et al., Advanced Metallization Conference 2004, Proceedings of the Conference, San Diego, (2005), 475-479. Publisher: Materials Research Society, Warrendale, Pa.

"Organic-Functionalized Pure-Silica-Zeolite MFI Low-k Films." Li, Shuang, et al. Chemistry of Materials (2005), 17(7), pp. 1851-1854.

"Repair of porous methylsilsesquioxane films using supercritical carbon dioxide." Xie, Bo, et al. Materials Research Society Symposium Proceedings (2004), 812 (Materials, Technology and Reliability for Advanced Interconnects and Low-k Dielectrics—2004), pp. 13-18.

"Rapid repair of plasma ash damage in low-k dielectrics using supercritical CO2." Gorman, B. P., et al., Journal of Vacuum Science & Technology, B: Microelectronics and Nanometer Structures—Processing, Measurement, and Phenomena (2004), 22(3), pp. 1210-1212.

"Water removal and repair of porous ultra low-k films using supercritical CO2." Xie, Bo, et al., Proceedings—Electrochemical Society (2004), 2003-26(Cleaning Technology in Semiconductor Device Manufacturing VIII), pp. 279-288.

"Backend Processing Using Supercritical CO2." Muscat, Anthony. University of Arizona. May 15, 2003. NSF/SRC Engineering Research Center for Environmentally Benign Semiconductor Manufacturing.

"Cleaning and Restoring k Value of Porous MSQ Films." Clark, Philip G., et al., Semiconductor International, (2003), 26(9), 46-48,50,52.

"Supercritical Carbon Dioxide-based Fluids Used as a Recovery Tool for Low-k Materials." Orozco-Teran, Rosa A., et al., Materials Research Society Symp. Proc. vol. 766. 2003. p. 297-302.

"Effects Of Supercritical Processing On Ultra Low-K Films," Reidy, R.F., et al., Advanced Metallization Conference, ed. B.M. Melnick, T.S. Cale, S. Zaima, T. Ohta, 2002. p. 602-606.

"Eliminating dielectric degradation of low-k organosilicate glass by trimethylchlorosilane treatment." Chang, T. C., et al., Journal of Vacuum Science & Technology, B: Microelectronics and Nanometer Structures (2002), 20(4), pp. 1561-1566.

"Effective repair to ultra-low-k dielectric material (k.apprx.2.0) by hexamethyldisilazane treatment." Mor, Y. S., et al., Journal of Vacuum Science & Technology, B: Microelectronics and Nanometer Structures (2002), 20(4), pp. 1334-1338.

"Recovering Dielectric Loss of Low Dielectric Constant Organic Siloxane during the Photoresist Removal Process." Chang, T. C., et al., Journal of the Electrochemical Society (2002), 149(8), pp. F81-F84.

Zielinski, E. M., et al., "Damascene Integration of Copper and Ultra-Low-k Xerogel for High Performance Interconnects", *IEEE IEDM Tech. Digest*, Dec. 1997, pp. 936-938 (1997).

P. Liu, et al., "Enhancing the Oxygen Plasma Resistance of Low-k Methylsilsesquioxane by $H_2$ Plasma Treatment," *Japanese Journal of Applied Physics*, vol. 38, p. 3482-3486 (1999).

Q. Han, et al., "Enabling Low-k Material Integration Through Low-ion Plasma Dry Strip Processes," *Micro Magazine*, p. 51-63 (Oct. 1999).

* cited by examiner

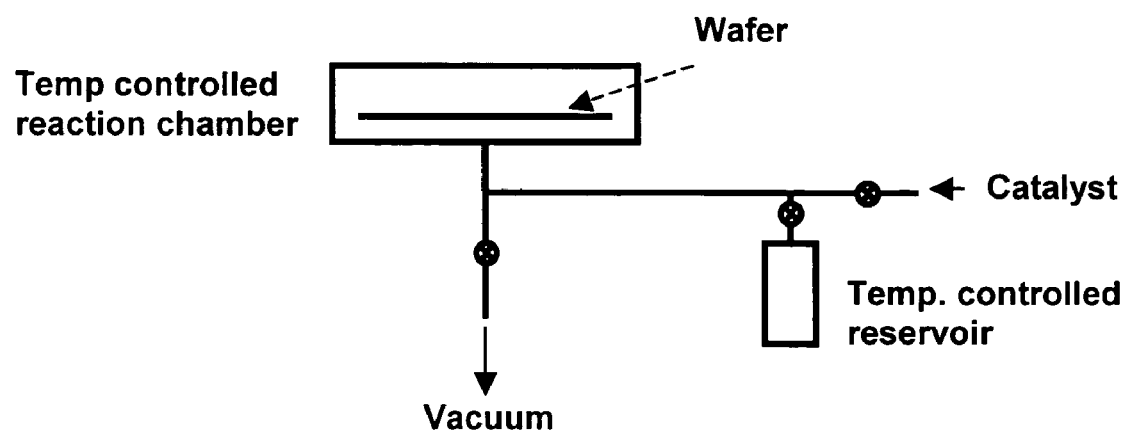
Figure 1: System Configuration A

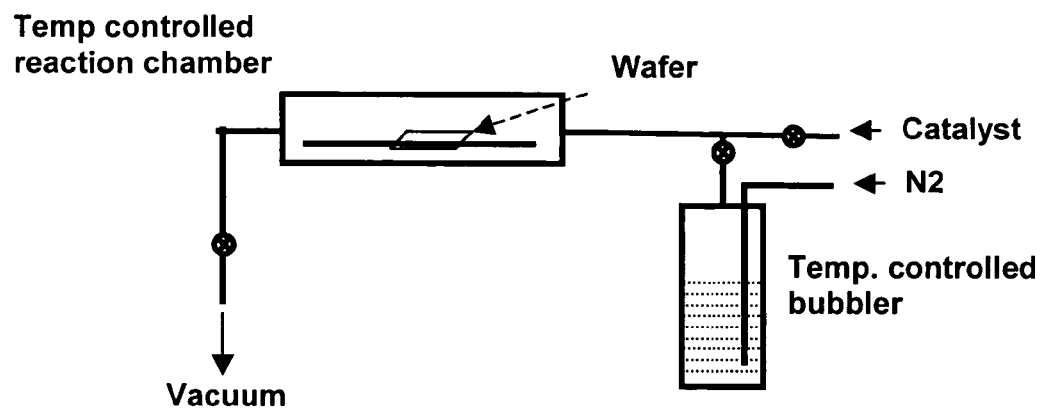
Figure 2: System Configuration B

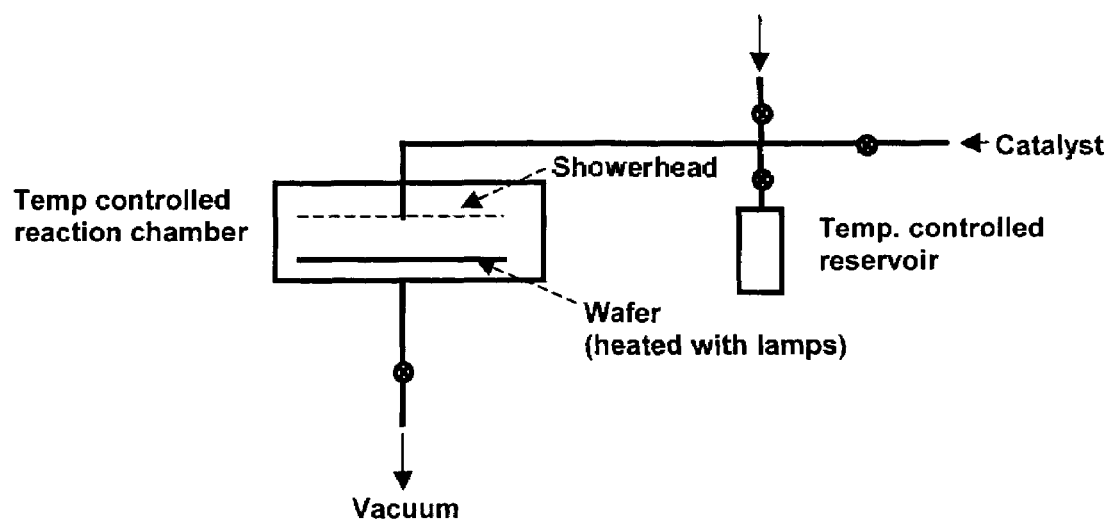
Figure 3: System Configuration C

VAPOR PHASE TREATMENT OF DIELECTRIC MATERIALS

BACKGROUND OF THE INVENTION

1. Field of the Invention

The invention concerns a method for applying a surface modification agent composition to organosilicate glass dielectric films. More particularly, the invention pertains to a method for treating a silicate or organosilicate dielectric film on a substrate, which film either comprises silanol moieties or has had at least some previously present carbon containing moieties removed therefrom. The treatment adds carbon containing moieties to the film and/or seals surface pores of the film, when the film is porous. These surface modified films are used as insulating materials in the manufacture of semiconductor devices such as integrated circuits ("ICs"), in order to ensure low dielectric constant and stable dielectric properties in these films.

2. Description of the Related Art

As semiconductor devices scale to lower technology nodes, the requirement for lower and lower dielectric constant (k) has been identified to mitigate RC delay. Similarly, as feature sizes in integrated circuits are reduced, problems with power consumption and signal cross-talk have become increasingly difficult to resolve. To achieve lower dielectric constant (2.6-3.0) in dense inorganic materials, carbon has been added to reduce the polarizability thus reducing the dielectric constant. To achieve ultra low dielectric constant (<2.4) materials, porosity is added to the carbon-rich dense matrix. While the introduction of carbon and porosity have reduced the dielectric constant, new challenges during back end of the line processing have also been identified. Specifically during etching and ashing, reactive gases have been found to damage the carbon at the surface of dense materials. Porous films having low dielectric constants have even more deleterious effects from reactive etch and ash gases due to diffusion through the film, which causes a greater extent of damage at the internal pore walls. Once the carbon has been damaged, the films rehydroxylate and hydrogen bond with water. Because water has a dielectric constant of 70, small amounts that are absorbed for dense materials and adsorbed for porous materials cause the dielectric constant to go up significantly. Also, porous materials tend to void after copper annealing due to the high tensile stress fields which will destroy device yields. None of these are acceptable and lead to unviable materials.

It is believed that the integration of low dielectric constant materials for interlevel dielectric (ILD) and intermetal dielectric (IMD) applications will help to solve these problems. While there have been previous efforts to apply low dielectric constant materials to integrated circuits, there remains a longstanding need in the art for further improvements in processing methods and in the optimization of both the dielectric and mechanical properties of such materials. Device scaling in future integrated circuits clearly requires the use of low dielectric constant materials as a part of the interconnect structure. Most candidates for low dielectric constant materials for use in sub-100 nm generation ICs are carbon containing $SiO_2$ films formed by either CVD or spin-on methods. During subsequent processing steps, such as plasma etching and photoresist removal using plasma or wet strip methods, significant damage occurs to these low-k materials, that causes fluorine addition and carbon depletion from the low-k material adjacent to the etched surface. In addition to a higher effective dielectric constant, the resultant structures are susceptible to void formation, outgassing and blister formation. The voids in turn may cause an increase in leakage current at elevated voltages and reduction in breakdown voltage. The present invention describes a way to reduce the damage and resulting issues by treating the wafers with silylating agents by a vapor deposition process such as chemical vapor deposition.

One way to approach this challenge is to repair the damaged area on dense surfaces, or in the case of porous materials on the internal pore walls with a re-methylating compound called a surface modification agent. Surface modification agents react with re-hydroxylated surfaces and re-alkylate or re-arylate them which in-turn restores the dielectric constant. In the case of porous internal pore wall surfaces, the re-methylation prevents void formation. Many times, the use of a surface modification agent allows for conventional etch and ash processes to be utilized with low and ultra low dielectric constant materials. The treatment could result in replenishment of carbon to the low-k film, usually restoring hydrophobicity and resistance to further damage during a wet cleaning operation. Additionally, it would be desirable if the repaired low-k material was found to be resistant to void formation, which generally occurs in untreated porous low dielectric inter-level dielectric regions during copper annealing processes. Silylating agents ("surface modification agents") can methylate the surface of $SiO_2$ based materials. Contemplated exposure includes vapor exposure with or without plasma. Normally, SiCOH based porous low-k materials are susceptible to void formation in ILD during Cu damascene processing. After a surface modification agent treatment, the resulting structure is significantly more resistant to void formation. Without being bound to any specific theory or mechanism, it is believed that plasma damage causes carbon depletion in the dielectric, by replacing Si—$CH_3$ bonds with Si—OH bonds. In damaged porous dielectrics, the pore surface is now covered with Si—OH bonds. In the presence of tensile stress (such as after Cu annealing), adjacent Si—OH groups can condense, thus causing local densification. The evolving reaction products and the stretching of the molecules due to the new links formed, causes voids to occur near the center of the ILD space. Surface modification agents prevent void formation by replacing most Si—OH bonds by Si—O—Si—Rx bonds, which avoid condensation reactions. Therefore void formation does not occur.

In addition, it is also known that existence of the SiO—$SiR_2$—OSi linkage (where the $SiR_2$ is one example of a surface modification functionality within the matrix), that the modulus of the porous material should improve. Modulus retention and improvement is required for most porous materials to withstand imposed stresses. The surface modifying linkage, e.g., a dimethylsilyl linkage, clearly improves the modulus. If applied to weakened areas of the silicate, an improvement of the material to external stress is expected.

The surface modification treatment performed after dielectric trench and via formation and etching and ashing steps repairs carbon depletion and damage to the low-k materials. By this means, voids are deterred and the later can withstand internal stresses caused by annealing treatments to the metal filling the trenches and vias.

The surface modifying treatment is conducted by exposing the wafer surface to the silylating agent in liquid or gas form for a period sufficient to complete the reaction with the damaged low dielectric constant region. Optionally, further treatments can be done, e.g. a high temperature bake to remove remaining solvent, excess surface modification agent, and by-products. Also, optionally, a wet cleaning operation can be performed immediately after the surface modification agent application, or after the baking step, using a commercially available chemical compatible with the low-k dielectric. Additionally a dehydration bake may be performed before the surface modification agent treatment, to increase effectiveness of the surface modification agent treatment.

The effectiveness of the surface modification agent treatment can be verified using unpatterned low-k dielectric films subjected to etching and ashing processing followed by the surface modification agent treatment. A successful surface modification agent treatment results in increased carbon concentration that can be measured by FTIR, EDX, or XPS techniques. Additionally, a water contact angle increase is seen, which demonstrates the hydrophobic nature of the post-treatment surface. The surface modification agent treated film also shows a lower dielectric constant compared to an etched/ashed film that is not treated with surface modification agent. In patterned wafers, the effectiveness of the surface modification agent treatment is demonstrated by reduction or elimination of voids in the low-k dielectric in narrow spaces between copper trenches after a copper anneal treatment following electroplating of copper, and also by lower profile change in trenches or vias after exposure to reactive solvents. It has been found that the effectiveness of silane based surface modification agents is enhances by an activating agent such as an amine, an onium compound or an alkali metal hydroxide.

SUMMARY OF THE INVENTION

The invention provides a method for treating a silicate or organosilicate dielectric film on a substrate, which silicate or organosilicate dielectric film either comprises silanol moieties or which silicate or organosilicate dielectric film has had at least some previously present carbon containing moieties removed therefrom, the method comprising:

(a) optionally dehydrating at least a portion of a silicate or organosilicate dielectric film on a substrate; then (b) optionally applying an activating agent for a surface modification agent composition to the silicate or organosilicate dielectric film; then (c) contacting the silicate or organosilicate dielectric film with a surface modification agent composition in a vapor or gaseous state, wherein the surface modification agent composition comprises a component capable of alkylating or arylating silanol moieties or bonds created by removal of carbon containing moieties from the silicate or organosilicate dielectric film via silylation; said contacting being conducted under conditions sufficient to (i) or (ii) or (iii):

(i) add carbon containing moieties to the silicate or organosilicate dielectric film, or (ii) seal surface pores of the silicate or organosilicate dielectric film, when the film is porous; or (iii) first add carbon containing moieties to the silicate or organosilicate dielectric film, and then seal surface pores of the silicate or organosilicate dielectric film, when the film is porous.

The invention also provides a method of preventing voids in a damaged silicate or organosilicate dielectric film on a substrate, which silicate or organosilicate dielectric film either comprises silanol moieties or which silicate or organosilicate dielectric film has had at least some previously present carbon containing moieties removed therefrom, the method comprising:

(a) optionally dehydrating at least a portion of a silicate or organosilicate dielectric film on a substrate; then (b) optionally applying an activating agent for a surface modification agent composition to the silicate or organosilicate dielectric film by chemical vapor deposition; then (c) contacting the silicate or organosilicate dielectric film with a surface modification agent composition by chemical vapor deposition of the surface modification agent composition to the silicate or organosilicate dielectric film, wherein the surface modification agent composition comprises a component capable of alkylating or arylating silanol moieties or bonds created by removal of carbon containing moieties from the silicate or organosilicate dielectric film via silylation; said contacting being conducted under conditions sufficient to add carbon containing moieties to the silicate or organosilicate dielectric film through at least a portion of a depth thereof.

The invention further provides a method of imparting hydrophobic properties to a silicate or organosilicate dielectric film on a substrate, which silicate or organosilicate dielectric film either comprises silanol moieties or which silicate or organosilicate dielectric film has had at least some previously present carbon containing moieties removed therefrom, the method comprising:

(a) optionally dehydrating at least a portion of a silicate or organosilicate dielectric film on a substrate; then (b) optionally applying an activating agent for a surface modification agent composition to the silicate or organosilicate dielectric film by chemical vapor deposition; then (c) contacting the silicate or organosilicate dielectric film with a surface modification agent composition by chemical vapor deposition of the surface modification agent composition to the silicate or organosilicate dielectric film, wherein the surface modification agent composition comprises a component capable of alkylating or arylating silanol moieties or bonds created by removal of carbon containing moieties from the silicate or organosilicate dielectric film via silylation; said contacting being conducted under conditions sufficient to (i) or (ii) or (iii):

(i) add carbon containing moieties to the silicate or organosilicate dielectric film through at least a portion of a depth thereof, or (ii) seal surface pores of the silicate or organosilicate dielectric film; or (iii) first add carbon containing moieties to the silicate or organosilicate dielectric film through at least a portion of a depth thereof, and then seal surface pores of the silicate or organosilicate dielectric film.

BRIEF DESCRIPTION OF THE DRAWINGS

FIG. 1 is a schematic representation of an equipment configuration for performing the inventive method.

FIG. 2 is a schematic representation of another equipment configuration for performing the inventive method.

FIG. 3 is a schematic representation of yet another equipment configuration for performing the inventive method.

DETAILED DESCRIPTION OF THE INVENTION

In the context of the present invention, dielectric materials having low dielectric constants, typically below 3 are especially desirable because they typically allow faster signal propagation, reduce capacitive effects and cross talk between conductor lines, and lower voltages to drive integrated circuits. This invention relates to both porous and non-porous dielectric materials. One material with a low dielectric constant is silica which can be applied as a foamed dielectric material. For the lowest possible dielectric values, air is introduced into silica dielectric materials. Air has a dielectric constant of 1, and when air is introduced into a silica dielectric material in the form of nanoporous or nanometer-scale pore structures, relatively low dielectric constants are achieved. It should be understood that unless the "$SiO_2$" functional group is specifically mentioned when the term "silica" is employed, the term "silica" as used herein, for example, with reference to porous and non-porous dielectric films, is intended to refer to silicate and organosilicate dielectric films prepared from an organic or inorganic glass base material, e.g., any suitable starting material containing one or more silicon-based dielectric precursors. It should also be understood that the use of singular terms herein is not intended to be so limited, but, where appropriate, also encompasses the plural, e.g., exemplary processes of the invention may be described as applying to and producing a "film" but it is intended that multiple films can be produced by the described, exemplified and claimed processes, as desired. The term, "film" as used herein with regard to the dielectric materials is intended to encompass any other suitable form or shape in which such silica dielectric materials are optionally employed. Nanoporous silica is attractive because it employs similar precursors, including organic-substituted silanes, e.g., tetramethoxysilane ("TMOS") and/or tetraethoxysilane ("TEOS"), as are used for the currently employed spin-on-glasses ("SOG") and chemical vapor disposition ("CVD") silica $SiO_2$. As used herein, the terms "void" and "pore" mean a free volume in which a mass is replaced with a gas or where a vacuum is generated. The composition of the gas is generally not critical, and appropriate gases include relatively pure gases and mixtures thereof, including air. The nanoporous polymer may comprise a plurality of pores. Pores are typically spherical, but may alternatively or additionally have any suitable shape, including tubular, lamellar, discoidal, or other shapes. The pores may be uniformly or randomly dispersed within the porous polymer. It is also contemplated that the pores may have any appropriate diameter. It is further contemplated that at least some pores may connect with adjacent pores to create a structure with a significant amount of connected or "open" porosity.

Nanoporous silica films have previously been fabricated by a number of methods. Suitable silicon-based precursor compositions and methods for forming nanoporous silica dielectric films, are described, for example, by the following co-owned U.S. Pat. Nos. 6,048,804, 6,022,812; 6,410,149; 6,372,666; 6,509,259; 6,218,497; 6,143,855, 6,037,275; 6,042,994; 6,048,804; 6,090,448; 6,126,733; 6,140,254; 6,204,202; 6,208,041; 6,318,124 and 6,319,855 all incorporated herein by reference herein.

Other dielectric and low dielectric materials comprise inorganic-based compounds, such as the silicon-based disclosed in commonly assigned pending U.S. patent application Ser. No. 10/078,919 filed Feb. 19, 2002; (for example NANOGLASS® and HOSP® products commercially available from Honeywell International Inc.). The dielectric and low dielectric materials may be applied by spin coating the material on to the surface, dip coating, spray coating, chemical vapor deposition (CVD), rolling the material onto the surface, dripping the material on to the surface, and/or spreading the material onto the surface. Dielectrics useful for this invention include CVD deposited materials, such as carbon doped oxides for example, Black Diamond, commercially available from Applied Materials, Inc., Coral, commercially available from Novellus, Aurora, which is commercially available from ASM, and Orion, which is commercially available from Trikon.

As used herein, the phrases "spin-on material", "spin-on organic material", "spin-on composition" and "spin-on inorganic composition" may be used interchangeable and refer to those solutions and compositions that can be spun-on to a substrate or surface using the spin coating application process. Examples of silicon-based compounds comprise siloxane compounds, such as methylsiloxane, methylsilsesquioxane, phenylsiloxane, phenylsilsesquioxane, methylphenylsiloxane, methylphenylsilsesquioxane, silazane polymers, silicate polymers and mixtures thereof. A contemplated silazane polymer is perhydrosilazane, which has a "transparent" polymer backbone where chromophores can be attached. Spin-on-glass materials also includes siloxane polymers and block polymers, hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about four. Also included are copolymers of hydrogensilsesquioxane and an alkoxyhydridosiloxane or hydroxyhydridosiloxane. Spin-on glass materials additionally include organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than zero and the sum of n and m is greater than about four and R is alkyl or aryl. Some useful organohydridosiloxane polymers have the sum of n and m from about four to about 5000 where R is a $C_1$-$C_{20}$ alkyl group or a $C_6$-$C_{12}$ aryl group. The organohydridosiloxane and organohydridosilsesquioxane polymers are alternatively denoted spin-on-polymers. Some specific examples include alkylhydridosiloxanes, such as methylhydridosiloxanes, ethylhydridosiloxanes, propylhydridosiloxanes, t-butylhydridosiloxanes, phenylhydridosiloxanes; and alkylhydridosilsesquioxanes, such as methylhydridosilsesquioxanes, ethylhydridosilsesquioxanes, propylhydridosilsesquioxanes, t-butylhydridosilsequioxanes, phenylhydridosilsesquioxanes, and combinations thereof. Several of the contemplated spin-on materials are described in the following issued patents and pending applications, which are herein incorporated by reference in their entirety: U.S. Pat. Nos. 6,506,497; 6,365,765; 6,268,457; 6,177,199; 6,358,559; 6,218,020; 6,361,820; 6,218,497; 6,359,099; 6,143,855; 6,512,071, U.S. patent application Ser. No. 10/001,143 filed Nov. 10, 2001; PCT/US00/15772 filed Jun. 8, 2000, and PCT/US00/00523 filed Jan. 7, 1999.

Solutions of organohydridosiloxane and organosiloxane resins can be utilized for forming caged siloxane polymer films that are useful in the fabrication of a variety of electronic devices, micro-electronic devices, particularly semiconductor integrated circuits and various layered materials for electronic and semiconductor components, including hard mask layers, dielectric layers, etch stop layers and buried etch stop layers. These organohydridosiloxane resin layers are compatible with other materials that might be used for layered materials and devices, such as adamantane-based compounds, diamantane-based compounds, silicon-core compounds, organic dielectrics, and nanoporous dielectrics. Compounds that are considerably compatible with the organohydridosiloxane resin layers contemplated herein are disclosed in U.S. Pat. Nos. 6,214,746; 6,171,687; 6,172,128; 6,156,812, U.S. Application Ser. No. 60/350,187 filed Jan. 15, 2002; U.S. patent application Ser. No. 09/538,276; U.S. patent application Ser. No. 09/544,504; U.S. patent application Ser. No. 09/587,851; and U.S. 60/347,195 filed Jan. 8, 2002; PCT Application PCT/US01/32569 filed Oct. 17, 2001; PCT Application PCT/US01/50812 filed Dec. 31, 2001, which are all incorporated herein by reference.

Suitable organohydridosiloxane resins utilized herein have the following general formulas:

$[H\text{—}Si_{1.5}]_n[R\text{—}SiO_{1.5}]_m$      Formula (1)

$[H_{0.5}\text{—}Si_{1.5-1.8}]_n[R_{0.5-1.0}\text{—}SiO_{1.5-1.8}]_m$      Formula (2)

$[H_{0-1.0}\text{—}Si_{1.5}]_n[R\text{—}SiO_{1.5}]_m$      Formula (3)

$[H\text{—}Si_{1.5}]_x[R\text{—}SiO_{1.5}]_y[SiO_2]_z$      Formula (4)

wherein:

the sum of n and m, or the sum or x, y and z is from about 8 to about 5000, and m or y is selected such that carbon containing constituents are present in either an amount of less than about 40 percent (Low Organic Content=LOSP) or in an amount greater than about 40 percent (High Organic Content=HOSP); R is selected from substituted and unsubstituted, normal and branched alkyls (methyl, ethyl, butyl, propyl, pentyl), alkenyl groups (vinyl, allyl, isopropenyl), cycloalkyls, cycloalkenyl groups, aryls (phenyl groups, benzyl groups, naphthalenyl groups, anthracenyl groups and phenanthrenyl groups), and mixtures thereof, and wherein the specific mole percent of carbon containing substituents is a function of the ratio of the amounts of starting materials. In some LOSP embodiments, particularly favorable results are obtained with the mole percent of carbon containing substituents being in the range of between about 15 mole percent to about 25 mole percent. In some HOSP embodiments, favorable results are obtained with the mole percent of carbon containing substituents are in the range of between about 55 mole percent to about 75 mole percent.

Nanoporous silica dielectric films with dielectric constants ranging from about 1.5 to about 4 can also be used as one of the layers. Nanoporous silica films are laid down as a silicon-based precursor, aged or condensed in the presence of water and heated sufficiently to remove substantially all of the porogen and to form voids in the film. The silicon-based precursor composition comprises monomers or prepolymers that have the formula: $R_x\text{—}Si\text{—}L_y$, wherein R is independently selected from alkyl groups, aryl groups, hydrogen and combinations thereof, L is an electronegative moiety, such as alkoxy, carboxy, amino, amido, halide, isocyanato and combinations thereof, x is an integer ranging from 0 to about 2, and y is an integer ranging from about 2 to about 4. Other nanoporous compounds and methods can be found in U.S. Pat. Nos. 6,171,687; 6,172,128; 6,214,746; 6,313,185; 6,380,347; and 6,380,270, which are incorporated herein in their entirety.

The phrases "cage structure", "cage molecule", and "cage compound" are intended to be used interchangeably and refer to a molecule having at least 10 atoms arranged such that at least one bridge covalently connects two or more atoms of a ring system. In other words, a cage structure, cage molecule or cage compound comprises a plurality of rings formed by covalently bound atoms, wherein the structure, molecule or compound defines a volume, such that a point located with the volume can not leave the volume without passing through the ring. The bridge and/or the ring system may comprise one or more heteroatoms, and may be aromatic, partially saturated, or unsaturated. Further contemplated cage structures include fullerenes, and crown ethers having at least one bridge. For example, an adamantane or diamantane is considered a cage structure, while a naphthalene compound or an aromatic spiro compound are not considered a cage structure under the scope of this definition, because a naphthalene compound or an aromatic spiro compound do not have one, or more than one bridge.

Contemplated cage compounds need not necessarily be limited to being comprised solely of carbon atoms, but may also include heteroatoms such as N, S, O, P, etc. Heteroatoms may advantageously introduce non-tetragonal bond angle configurations. With respect to substituents and derivatizations of contemplated cage compounds, it should be recognized that many substituents and derivatizations are appropriate. For example, where the cage compounds are relatively hydrophobic, hydrophilic substituents may be introduced to increase solubility in hydrophilic solvents, or vice versa. Alternatively, in cases where polarity is desired, polar side groups may be added to the cage compound. It is further contemplated that appropriate substituents may also include thermolabile groups, nucleophilic and electrophilic groups. It should also be appreciated that functional groups may be utilized in the cage compound (e.g., to facilitate crosslinking reactions, derivatization reactions, etc.). Cage molecules or compounds, as described in detail herein, can also be groups that are attached to a polymer backbone, and therefore, can form nanoporous materials where the cage compound forms one type of void (intramolecular) and where the crosslinking of at least one part of the backbone with itself or another backbone can form another type of void (intermolecular). Additional cage molecules, cage compounds and variations of these molecules and compounds are described in detail in PCT/US01/32569 filed on Oct. 18, 2001, which is herein incorporated by reference in its entirety. Contemplated polymers may also comprise a wide range of functional or structural moieties, including aromatic systems, and halogenated groups. Furthermore, appropriate polymers may have many configurations, including a homopolymer, and a heteropolymer. Moreover, alternative polymers may have various forms, such as linear, branched, super-branched, or three-dimensional. The molecular weight of contemplated polymers spans a wide range, typically between 400 Dalton and 400000 Dalton or more. Additives can also be used to enhance or impart particular properties, as is conventionally known in the polymer art, including stabilizers, flame retardants, pigments, plasticizers, surfactants, and the like. Compatible or non-compatible polymers can be blended in to give a desired property. Adhesion promoters can also be used. Such promoters are typified by hexamethyldisilazane, which can be used to interact with available hydroxyl functionality that may be present on a surface, such as silicon dioxide, that was exposed to moisture or humidity. Polymers for microelectronic applications desirably contain low levels (generally less than 1 ppm, preferably less than 10 ppb) of ionic impurities, particularly for dielectric interlayers.

The materials, precursors and layers described herein can be and in many ways are designed to be solvated or dissolved in any suitable solvent, so long as the resulting solutions can be applied to a substrate, a surface, a wafer or layered material. Typical solvents are also those solvents that are able to solvate the monomers, isomeric monomer mixtures and polymers. Contemplated solvents include any suitable pure or mixture of organic or inorganic molecules that are volatilized at a desired temperature, such as the critical temperature, or that can facilitate any of the above-mentioned design goals or needs. The solvent may also comprise any suitable single polar and non-polar compounds or mixture thereof. As used herein, the term "polar" means that characteristic of a molecule or compound that creates an unequal charge, partial charge or spontaneous charge distribution at one point of or along the molecule or compound. As used herein, the term "non-polar" means that characteristic of a molecule or compound that creates an equal charge, partial charge or spontaneous charge distribution at one point of or along the molecule or compound. In some contemplated embodiments, the solvent or solvent mixture (comprising at least two solvents) comprises those solvents that are considered part of the hydrocarbon family of solvents. Hydrocarbon solvents are those solvents that comprise carbon and hydrogen. It should be understood that a majority of hydrocarbon solvents are non-polar; however, there are a few hydrocarbon solvents that could be considered polar. Hydrocarbon solvents are generally broken down into three classes: aliphatic, cyclic and aromatic. Aliphatic hydrocarbon solvents may comprise both straight-chain compounds and compounds that are branched and possibly crosslinked, however, aliphatic hydrocarbon solvents are not considered cyclic. Cyclic hydrocarbon solvents are those solvents that comprise at least three carbon atoms oriented in a ring structure with properties similar to aliphatic hydrocarbon solvents. Aromatic hydrocarbon solvents are those solvents that comprise generally three or more unsaturated bonds with a single ring or multiple rings attached by a common bond and/or multiple rings fused together. Contemplated hydrocarbon solvents include toluene, xylene, p-xylene, m-xylene, mesitylene, solvent naphtha H, solvent naphtha A, alkanes, such as pentane, hexane, isohexane, heptane, nonane, octane, dodecane, 2-methylbutane, hexadecane, tridecane, pentadecane, cyclopentane, 2,2,4-trimethylpentane, petroleum ethers, halogenated hydrocarbons, such as chlorinated hydrocarbons, nitrated hydrocarbons, benzene, 1,2-dimethylbenzene, 1,2,4-trimethylbenzene, mineral spirits, kerosene, isobutylbenzene, methylnaphthalene, ethyltoluene, ligroine. Particularly contemplated solvents include, but are not limited to, pentane, hexane, heptane, cyclohexane, benzene, toluene, xylene and mixtures or combinations thereof.

In other contemplated embodiments, the solvent or solvent mixture may comprise those solvents that are not considered part of the hydrocarbon solvent family of compounds, such as ketones, such as acetone, 3-pentanone, diethyl ketone, methyl ethyl ketone and the like, alcohols, ketones, esters, ethers and amines. In yet other contemplated embodiments, the solvent or solvent mixture may comprise a combination of any of the solvents mentioned herein. In some embodiments, the solvent comprises water, ethanol, propanol, acetone, ethylene oxide, benzene, toluene, ethers, cyclohexanone, butyrolactone, methylethylketone, and anisole.

It is still further contemplated that alternative low dielectric constant material may also comprise additional components. For example, where the low dielectric constant material is exposed to mechanical stress, softeners or other protective agents may be added. In other cases where the dielectric material is placed on a smooth surface, adhesion promoters may advantageously employed. In still other cases, the addition of detergents or antifoam agents may be desirable. In general, a precursor in the form of, e.g., a spin-on-glass composition that includes one or more removable solvents, is applied to a substrate, and then polymerized and subjected to solvent removal in such a way as to form a dielectric film comprising nanometer-scale pores.

When forming such nanoporous films, e.g., wherein the precursor is applied to a substrate by spin-coating, the film coating is typically catalyzed with an acid or base catalyst and water to cause polymerization/gelation ("aging") during an initial heating step. The film is then cured, e.g., by subjecting the film to one or more higher temperature heating steps to, inter alia, remove any remaining solvent and complete the polymerization process, as needed. Other curing methods include subjecting the film to radiant energy, e.g., ultraviolet, electron beam, microwave energy, and the like.

U.S. Pat. Nos. 6,204,202 and 6,413,882, incorporated by reference herein, provide silicon-based precursor compositions and methods for forming nanoporous silica dielectric films by degrading or vaporizing one or more polymers or oligomers present in the precursor composition. U.S. Pat. No. 6,495,479, provides silicon-based precursor compositions and methods for forming nanoporous silica dielectric films by degrading or vaporizing one or more compounds or polymers present in the precursor composition. U.S. Pat. No. 5,895,263 describes forming a nanoporous silica dielectric film on a substrate, e.g., a wafer, by applying a composition comprising decomposable polymer and organic polysilica i.e., including condensed or polymerized silicon polymer, heating the composition to further condense the polysilica, and decomposing the decomposable polymer to form a porous dielectric layer.

Processes for application of precursor to a substrate, aging, curing, planarization, and rendering the film(s) hydrophobic are described, for example, in U.S. Pat. Nos. 6,589,889 and 6,037,275, among others. Substrates and wafers contemplated herein may comprise any desirable substantially solid material. Particularly desirable substrate layers would comprise films, glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and it's oxides), a polymer-based packaging or board interface such as found in a polyimide-based flex package, lead or other metal alloy solder ball surface, glass and polymers such as polyimide. The "substrate" may even be defined as another polymer chain when considering cohesive interfaces. In more preferred embodiments, the substrate comprises a material common in the packaging and circuit board industries such as silicon, copper, glass, and another polymer.

Subsequent semiconductor manufacturing processes such as deposition of cap film by PECVD techniques, and via and trench formation by patterning by means of etching and ashing, atomic layer deposition, physical vapor deposition, and a chemical vapor deposition treatment tend to remove carbon containing moieties which are hydrophobic groups from the organosilicate glass dielectric films and replace them with silanol groups. Undesirable properties result when the organosilicate glass dielectric films contain silanol groups. Silanols, and the water that they can adsorb from the air are highly polarizable in an electric field, and thus will raise the dielectric constant of the film, and will lower resistance to wet cleaning chemistries and increase volatile evolution. Also, when the trenches and vias are filled with a metal and subjected to an annealing treatment, metal shrinkage induces a stress on the via and trench walls and cause undesirable voids to form inside the dielectric material between the vias and trenches. When the film is an organosilicate dielectric film, it has often been has been previously subjected to at least one damaging treatment which removes at least a portion of previously existing carbon containing moieties from the organosilicate dielectric film. Such film damage can result from such treatments as chemical exposure, plasma exposure, thermal treatment, vacuum treatment, ionizing radiation exposure, electron beam exposure, UV exposure, etching, ashing, wet cleaning, plasma enhanced chemical vapor deposition, supercritical fluid exposure and combinations thereof. These treatments remove at least a portion of previously existing carbon containing moieties from the silicate or organosilicate dielectric film. Typically these treatments remove from about 5 to about 95% of previously existing carbon containing moieties. The inventive process is conducted to add back these carbon containing moieties to the silicate or organosilicate dielectric film.

In order to remedy this problem, the organosilicate glass dielectric films are made substantially free of silanols and water by treatment with a surface modification agent to restore carbon containing moieties and usually increase the hydrophobicity of the organosilicate glass dielectric film. This makes the film resistant to stresses, such as induced by metal shrinkage during annealing, stress from other dielectric layers, and stress during packaging, thus deters undesirable voids from forming inside the dielectric material between the vias and trenches.

Etching and plasma remove hydrophobic functional groups. Damage to organosilicate glass dielectric films during semiconductor manufacturing processes results from the application of aggressive plasmas and/or etching reagents to etch trenches and vias into dielectric films. Plasmas are also used to remove photoresist films during fabrication of semiconductor devices. The plasmas used are typically composed of the elements oxygen, fluorine, hydrogen, carbon, argon, helium or nitrogen (in the form of free atoms, compounds, ions and/or radicals).

Dielectric films which are exposed to these plasmas during trench, via, etch and/or photoresist removal are easily degraded or damaged. Porous dielectric films have a very high surface area and are therefore particularly vulnerable to plasmas damage. In particular, silica based dielectric films which have organic content (such as methyl groups bonded to Si atoms) are readily degraded by oxygen plasmas. The organic group is oxidized into $CO_2$ and a silanol or Si—OH group remains on the dielectric surface where the organic group formerly resided. Porous and non-porous low dielectric constant silica films depend on such organic groups (on surfaces) to remain hydrophobic. Loss of the hydrophobicity makes the dielectric constant rise (the low dielectric constant of such films is the key desired property of such materials).

Wet chemical treatments are also used in IC production for the purpose of removing residues leftover after trench or via etching. The chemicals used are often so aggressive they will attack and remove organic groups in silica based dielectric films, especially porous silica films. Again, this damage will cause the films to lose their hydrophobicity. Wet chemical etchants include, for example, amides, such as N-methylpyrrolidinone, dimethylformamide, dimethylacetamide; alcohols such as ethanol and 2-propanol; alcoholamines such as ethanolamine; amines such as triethylamine; diamines such as ethylenediamine and N,N-diethylethylenediamine; triamines such as diethylenetriamine, diamine acids such as ethylenediaminetetracetic acid "EDTA"; organic acids such as acetic acid and formic acid; the ammonium salts of organic acids such as tetramethylammonium acetate; inorganic acids such as sulfuric acid, phosphoric acid, hydrofluoric acid; fluoride salts such as ammonium fluoride; and bases such as ammonium hydroxide and tetramethyl ammonium hydroxide; and hydroxyl amine; commercial formulations developed for post etch wet cleaning such as EKC 505, 525, 450, 265, 270, and 630 (EKC Corp., Hayward Calif.), and ACT-CMI and ACT-690 (Ashland Chemical, Hayward, Calif.). to name but a few art-known etchants. Ashing agents include plasmas derived from hydrogen, nitrogen, helium, argon, oxygen, and mixtures derived therefrom, and the like.

In order to solve the above mentioned problems the inventive treatment methods imparting desirable properties to dielectric films present on a substrate during the process of fabricating a semiconductor or IC device.

The first step of the inventive process is an optional but preferred step of dehydrating at least a portion of a silicate or organosilicate dielectric film on a substrate. Such may be done by any means known in the art such as heating at a temperature of from about 20° C. to about 450° C., preferably from about 100° C. to about 400° C. for from about 10 seconds to about 4 hours, preferably from about 1 minute to 120 minutes, and more preferably from about 10 seconds to about 30 minutes. The dehydration bake removes substantially all of the moisture which may have been adsorbed in the dielectric film. Removal of moisture from the dielectric prior to surface modification agent treatment renders the subsequent treatments more effective.

The next step of the inventive process is an optional but preferred step of applying an activating agent for a surface modification agent composition to the silicate or organosilicate dielectric film. Useful activating agents non-exclusively include amines, onium compounds and alkali metal hydroxides. Useful activating agents include ammonium compounds, phosphonium compounds, sulfonium compounds and iodonium compounds. Included are activating agents which may be alkyl amines, aryl amines, alcohol amines and mixtures thereof which suitably have a boiling point of about 100° C. or higher, usually about 125° C. or higher and more usually about 150° C. or higher. Catalyst exposure may be conducted by applying a gas or vapor of the activating agent to the film on the substrate at a temperature of from about 20° C. to about 450° C., preferably from about 100° C. to about 400° C. for from about 10 seconds to about 30 minutes, preferably from about 1 minute to 30 minutes.

Useful amine activating agent include primary amines, secondary amines, tertiary amines, ammonia, and quaternary ammonium salts. Useful amines are monoethanolamine, diethanolamine, triethanolamine, monoisopropanolamine, tetraethylenepentamine, 2-(2-aminoethoxy)ethanol; 2-(2-aminoethylamino)ethanol and mixtures thereof. In a desired embodiment of the invention the activating agent comprises tetramethylammonium acetate, tetrabutylammonium acetate or combinations thereof. Other activating agents include sodium hydroxide, potassium hydroxide, lithium hydroxide and ammonium hydroxide. The activating agent may be applied to the film by any convenient method such as coating, spin-on, dipping, vapor application, chemical vapor deposition, and the like. The activating agent is usually applied to the film amount of from about 0.0001 weight percent to about 10 weight percent, more usually from about 0.001 weight percent to about 1 weight percent, and most usually from about 0.01 weight percent to about 0.1 weight percent, based on the weight of the subsequently applied surface modification agent composition.

The next step in the inventive method is contacting the silicate or organosilicate dielectric film with a surface modification agent composition in a vapor or gaseous state. For purposes of this invention, such contacting of the silicate or organosilicate dielectric film with a surface modification agent composition is defined as a contacting of the film which either has or has not been first dehydrated and has or has not been contacted with an activating agent for the surface modification agent.

The surface modification agent composition comprises a component capable of alkylating or arylating silanol moieties or bonds created by removal of carbon containing moieties from the silicate or organosilicate dielectric film via silylation; said contacting being conducted under conditions sufficient to (i) or (ii) or (iii):

(i) add carbon containing moieties to the silicate or organosilicate dielectric film, or (ii) seal surface pores of the silicate or organosilicate dielectric film, when the film is porous; or (iii) first add carbon containing moieties to the silicate or organosilicate dielectric film, and then seal surface pores of the silicate or organosilicate dielectric film, when the film is porous.

A suitable surface modification agent composition includes one or more surface modification agents able to remove silanol groups from the surface of an etched and/or ashed organosilicate glass dielectric film that it is desired to render hydrophobic. These may be silane, silazane, silanols, or carboxysilyl. For example, a surface modification agent is a compound having a formula selected from the Formulas:

(1) [—$SiR_2NR'$—]n where n>2 and may be cyclic; (2) $R_3SiNR'SiR_3$, (3) $(R_3Si)_3N$; (4) $R_3SiNR'_2$; (5) $R_2Si(NR_2')_2$; (6) $RSi(NR_2')_3$; (7) $R_xSiCl_y$, (8) $R_xSi(OH)_y$, (9) $R_3SiOSiR'_3$, (10) $R_xSi(OR')_y$, (11) $R_xSi(OCOR')_y$, (12) $R_xSiH_y$; (13) $R_xSi[OC(R')=R'']_{4-x}$ and combinations thereof, wherein x is an integer ranging from 1 to 3, y is an integer ranging from 1 to 3 such that y=4-x; each R is an independently selected from hydrogen and a hydrophobic organic moiety. The R groups are preferably independently selected from the group of organic moieties consisting of alkyl, aryl and combinations thereof. The R' group may be H, alkyl, aryl, or carbonyl such as COR, CONR, $CO_2R$. The R" may be alkyl or carbonyl such as COR, CONR, $CO_2R$ For all surface modification agents, the reactive silyl group must contain a hydrolyzable leaving group such as but not limited to —Cl, —Br, —I, —OR, —$NR_x$ (where x=1-2), —OCOR, —$OCO_2R$, —NRCOR, —$NRCO_2R$, —NRCONR, —SR, —$SO_2R$. For reaction of the surface modification agent, hydrolysis may occur spontaneously with moisture present during the surface modification agent application and process, or pre-hydrolysis may be forced during the formulation process.

The alkyl moiety is either functionalized or non-functionalized and is derived from groups of straight alkyl, branched alkyl, cyclic alkyl and combinations thereof, and wherein said alkyl moiety ranges in size from $C_1$ to about $C_{18}$. The functionalization may be a carbonyl, a halide, an amine, an alcohol, an ether, a sulfonyl or sulfide. The aryl moiety is substituted or unsubstituted and ranges in size from $C_5$ to about $C_{18}$. Preferably the surface modification agent is an acetoxysilane, or, for example, a monomer compound such as acetoxysilane, acetoxytrimethylsilane, diacetoxysilane, triacetoxysilane, acetoxytrimethylsilane, diacetoxydimethylsilane, methyltriacetoxysilane, phenyltriacetoxysilane, diphenyldiacetoxysilane, methyltriethoxysilane, dimethyldiethoxysilane, trimethylethoxysilane, methyltrimethoxysilane, dimethyldimethoxysilane, trimethylmethoxysilane, methyltrichlorosilane, dimethyldichlorosilane, trimethylchlorsilane, methylsilane, dimethylsilane, trimethylsilane, hexamethyldisilazane, hexamethylcyclotrisilazane, bis(dimethylamino)dimethylsilane, bis(diethylamino)dimethylsilane, tris(dimethylamino)methylsilane, tris(dimethylamino)phenylsilane, tris(dimethylamino)silane, dimethylsilyldiformamide, dimethylsilyldiacetamide, dimethylsilyldiisocyante, trimethylsilylisocyanate, methylsilyltriisocyanate, 2-trimethylsiloxypent-2-ene-4-one, n-(trimethylsilyl)acetamide, 2-(trimethylsilyl) acetic acid, n-(trimethylsilyl)imidazole, trimethylsilylpropiolate, trimethylsilyl(trimethylsiloxy)-acetate, nonamethyltrisilazane, hexamethyldisiloxane, trimethylsilanol, triethylsilanol, triphenylsilanol, t-butyldimethylsilanol, diphenylsilanediol, trimethoxysilane, triethoxysilane, trichlorosilane, and combinations thereof. In one noteworthy embodiment, the surface modification agent is methyltriacetoxysilane. In a preferred embodiment the surface modification agent is dimethyldiacetoxysilane.

Additional surface modification agents include multifunctional surface modification agents as described in detail in U.S. Pat. No. 6,208,014, incorporated by reference herein, as described above. Such multifunctional surface modification agents can be applied in either vapor form, gaseous form, or by chemical vapor depositing, optionally with or without co-solvents.

Suitable co-solvents include, e.g., ketones, such as acetone, diisopropylketone, 2-heptanone, 3-pentanone, and others, as described in detail in co-owned U.S. Pat. No. 6,395,651, the disclosure of which is incorporated by reference herein.

For example, as described in detail in U.S. Pat. No. 6,208,014, certain preferred surface modification agents will have two or more functional groups and react with surface silanol functional groups while minimizing mass present outside the structural framework of the film, and include, e.g., surface silanols may condense with suitable silanols such as

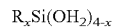
$R_xSi(OH_2)_{4-x}$ wherein x=1-3, and each R is independently selected moieties, such as H and/or an organic moiety such as an alkyl, aryl or derivatives of these. When R is an alkyl, the alkyl moiety is optionally substituted or unsubstituted, and may be straight, branched or cyclic, and preferably ranges in size from $C_1$ to about $C_{18}$, or greater, and more preferably from $C_1$ to about $C_8$. When R is aryl, the aryl moiety preferably consists of a single aromatic ring that is optionally substituted or unsubstituted, and ranges in size from $C_5$ to about $C_{18}$, or greater, and more preferably from $C_5$ to about $C_8$. In a further option, the aryl moiety is a heteroaryl.

In another embodiment, alkoxy silanes may be used as the surface modification agent, e.g. suitable alkoxy silanes such as

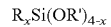
$R_xSi(OR')_{4-x}$ wherein R are independently selected moieties, such as H and/or an organic moiety such as an alkyl, aryl or derivatives of these; R' are independently selected alkyl or aryl moieties. When R or R' is an alkyl, the alkyl moiety is optionally substituted or unsubstituted, and may be straight, branched or cyclic, and preferably ranges in size from $C_1$ to about $C_{18}$, or greater, and more preferably from $C_1$ to about $C_8$. When R or R' is aryl, the aryl moiety preferably consists of a single aromatic ring that is optionally substituted or unsubstituted, and ranges in size from $C_5$ to about $C_{18}$, or greater, and more preferably from $C_5$ to about $C_8$. In a further option, the aryl moiety is a heteroaryl. Thus, the R groups independently selected from H, methyl, ethyl, propyl, phenyl, and/or derivatives thereof, provided that at least one R is organic. In one embodiment, both R groups are methyl, and a tri-functional surface modification agent is methyltrimethoxysilane.

In another embodiment, a suitable silane according to the invention has the general formula of

$R_xSi(NR_2)_{4-x}$ wherein X=1-3, R are independently H, alkyl and/or aryl. When any R are alkyl and/or aryl. In preferred embodiments, R is selected from H, $CH_3$, $C_6H_5$, and $R_2$ and $R_3$ are both $CH_3$. Thus tri-functional surface modification agents include, e.g., tris(dimethylamino)methylsilane, tris(dimethylamino)phenylsilane, and/or tris(dimethylamino)silane. In addition, disubstituted silanes may be used such as hexamethylcyclotrisilazane, bisdimethylaminodimethylsilane, and bisdiethylaminodimethylsilane.

In yet another embodiment, a suitable silane according to the invention has the general formula of

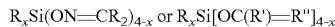
$R_xSi(ON=CR_2)_{4-x}$ or $R_xSi[OC(R')=R'']_{4-x}$ wherein x=1-3 and the R groups are independently H, alkyl and/or aryl, R' may be H, alkyl, aryl, alkoxy or aryloxy, and R'' may be alkyl or carbonyl. Thus modification agents include, e.g., methyltris(methylethylketoxime)silane or 2-trimethylsiloxypent-2-ene-4-one respectively.

In yet another embodiment, a suitable silane according to the invention has the general formula of

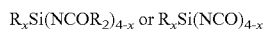
$R_xSi(NCOR_2)_{4-x}$ or $R_xSi(NCO)_{4-x}$ wherein x=1-3, R groups are independently H, alkyl and/or aryl. Thus surface modification agents include, e.g., dimethylsilyldiformamide, dimethylsilyldiacetamide, dimethylsilyldiisocyante, trimethylsilyltriisocyante.

In yet a further embodiment, a suitable silane according to the invention has the general formula of

$R_xSiCl_{4-x}$ wherein x=1-3, is H, alkyl or aryl. In one preferred embodiment, $R_x$ is $CH_3$. Thus tri-functional surface modification agents include, e.g., methyltrichlorosilane.

In a more preferred embodiment, the surface modification agent includes one or more organoacetoxysilanes which have the following general formula,

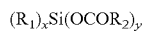
$(R_1)_xSi(OCOR_2)_y$

Preferably, x is an integer ranging in value from 1 to 2, and x and y can be the same or different and y is an integer ranging from about 2 to about 3, or greater.

Useful organoacetoxysilanes, including multifunctional alkylacetoxysilane and/or arylacetoxysilane compounds, include, simply by way of example and without limitation, methyltriacetoxysilane ("MTAS"), dimethyldiacetoxysilane (DMDAS), phenyltriacetoxysilane and diphenyldiacetoxysilane and combinations thereof.

The component capable of alkylating or arylating silanol moieties of the organosilicate glass dielectric film via silylation is usually present in the surface modification agent composition in an amount of from about 0.1 weight percent to about 100 weight percent, more usually from about 1 weight percent to about 50 weight percent, and most usually from about 3 weight percent to about 30 weight percent.

The surface modification agent composition may optionally contain one or more of the activating agents listed above. When incorporated within the surface modification agent composition, the activating agent is usually present in an amount of from about 0.0001 weight percent to about 10 weight percent, more usually from about 0.001 weight percent to about 1 weight percent, and most usually from about 0.01 weight percent to about 0.1 weight percent of the surface modification agent composition.

Optionally, the surface modification agent composition includes a solvent composition capable of solubilizing with the component capable of alkylating or arylating silanol moieties of the organosilicate glass dielectric film via silylation, and the activating agent. Suitable solvents compositions non-exclusively include, for example, ketones, ethers, esters, hydrocarbons, alcohols, carboxylic acids, amides, and combinations thereof. Useful solvents non-exclusively include 3-pentanone, 2-heptanone, gammabutyrolactone, propylene glycol methyl ether acetate, acetic acid, and combinations thereof. The solvent, when employed, is usually present in the surface modification agent composition in an amount of from about 0 weight percent to about 99.9 weight percent, more usually from about 50 weight percent to about 99 weight percent, and most usually from about 70 weight percent to about 97 weight percent. In another embodiment of the invention, the surface modification agent composition includes a supercritical solvent, such as supercritical carbon dioxide.

Optionally, the surface modification agent composition includes a corrosion inhibitor, such as a corrosion inhibitor which chelates with copper. Such may include benzotriazole, tolyltriazole, and combinations thereof. The corrosion inhibitor, when employed, is usually present in the surface modification agent composition in an amount of from about 0.001 weight percent to about 10 weight percent, more usually from about 0.01 weight percent to about 5 weight percent, and most usually from about 0.2 weight percent to about 1 weight percent.

The surface modification agent composition is formed by blending the selected components into a mixture. The surface modification agent composition contacts the damaged silica dielectric film as a vapor, gas, and/or plasma. Contacting by applying a gas or vapor of the surface modification agent to the film is preferred. Such contacting may be conducted at a temperature of from about 0° C. to about 450° C., preferably from about 20° C. to about 450° C. The contacting may be conducted for from about 1 second to about 2 hours, preferably from about 10 seconds to about 30 minutes. Preferably the contacting is conducted under controlled chamber conditions using a carrier gas, such as nitrogen, helium or argon which serves to control the chamber conditions (pressure) and to uniformly distribute the reactants, i.e. the surface modification composition including activation agents and solvents used. Preferably the carrier gas is miscible with these components.

The surface modification agent composition may also be applied by chemical vapor deposition techniques. Chemical vapor deposition processes are well known to those skilled in the art and chemical vapor deposition reactors are widely commercially available. One suitable reactor is model SK-23-6-93 commercially available from Vactronic Equipment Labs of Bohemia, New York. Others may be obtained from ASM International, Novellus Systems, or Applied Materials. The chemical vapor depositing is conducted by heating at a relatively low temperature of from about 100° C. to about ° C., preferably from about 200° C. to about 400° C. and more preferably from about 350° C. to about 400° C. The heating during the chemical vapor depositing is conducted at a relatively short time of from about 30 seconds to about 3 minutes. In the process, film on substrate is placed in the chemical vapor deposition reactor. The reactor is sealed and evacuated to less than one millitorr of ambient background gas pressure. In the preferred embodiment, a flow of surface modification agent composition and an inert gas, such as nitrogen, helium or argon is established and the chamber is heated until it is stabilized to the desired reaction temperature and gas flow rate. The gas flow ranges from 0 to about 5,000 sccm (standard cubic centimeters per minute measured at 0° C. and atmospheric pressure) or preferably from about 500 to about 2,000 sccm and most preferably about 1,000 sccm. The reactor gas pressure preferably ranges from about 0.1 to about 760 torr, more preferably from about 0.2 to about 400 torr and most preferably from about 0.25 to about 2.0 torr.

In one case, the surface modification agent composition treatment is conducted until carbon containing moieties are added to the silicate or organosilicate dielectric film. Usually this is through a depth thereof such that at least 10% of the silanol moieties or bonds created by removal of carbon containing moieties from the silicate or organosilicate dielectric film are silylated. In another case, when the silicate or organosilicate dielectric film has pores, the surface modification treatment is conducted under conditions sufficient to seal pores at a surface of the organosilicate dielectric film to a depth of about 50 Å or less. 15. The pores at the surface of the silicate or organosilicate dielectric film are preferably sealed, to such an extent that a subsequent exposure to (i) precursors for chemical vapor deposition of nitride, carbide, metals, or (ii) non-etching wet cleaning materials does not allow a penetration thereof to a depth greater than 5 times the maximum pore size.

Optionally the inventive method further comprises the subsequent step of subjecting the silicate or organosilicate dielectric film to a treatment sufficient to effect (i) an increased addition of carbon containing moieties to the silicate or organosilicate dielectric film or (ii) an increased sealing of surface pores of the silicate or organosilicate dielectric film; or (iii) first an increased addition of carbon containing moieties to the silicate or organosilicate dielectric film and then an increased sealing of surface pores of the silicate or organosilicate dielectric film or (iv) removing at least some residual activating agent, surface modification agent, by-products; and combinations thereof. This may be done by heating, ultraviolet radiation, plasma energy, electron beam, ion beam or combinations thereof, under conditions to effect such results. Heating may be done at a temperature of from about 20° C. to about 450° C., preferably from about 100° C. to about 400° C. for from about 10 seconds to about 120 minutes, preferably from about 10 seconds to about 120 minutes.

In yet another embodiment, a wet clean using chemicals such as AP395 or dilute HF is performed after the abovementioned embodiments. The wet clean is useful to remove any resist residues remaining after the ash. Untreated low-k dielectric materials after etch and ash are prone to attack by the wet clean agents. The surface modification agent treatment significantly improves resistance of the low-k dielectric to attack by wet clean.

In yet another embodiment, the wet clean can be performed before the bake process in the first contemplated embodiment. The high temperature bake step is performed after the wet clean. An advantage of this method can be that the wet clean can remove excess surface modification agent and any reaction product. This can result in lower volatile components in the dielectric material and a cleaner copper surface. Both can result in an improved long term reliability.

In another embodiment, the surface modification agent composition is provided by exposing the dielectric film to a plasma which is derived from any of the above mentioned surface modification agent. In a typical procedure, the organosilicate glass dielectric film is placed in a plasma generating chamber, such as a plasma enhanced chemical vapor deposition (PECVD) system; the vapor of a surface modification agent composition and argon vapor are passed through the plasma generating chamber; then an RF energy source is activated to create a plasma; the argon gas is included to help promote the formation of plasma. The plasma is composed of ionic fragments derived from the surface modification agent composition; for example, the ion fragment $CH_3Si^+$ is generated from methylsilane ($CH_3SiH_3$). This fragment reacts with silanol groups to form hydrophobic Si—$CH_3$ moieties. Any of the above mentioned surface modification agent compositions can be used for this plasma induced surface treatment.

Other reagents for plasma induced surface modification agent compositions include aldehydes, esters, acid chlorides, and ethers. Suitable aldehydes include acetaldehyde and benzaldehyde; suitable esters include ethyl acetate and methyl benzoate; suitable acid chlorides include acetyl chloride and benzyl chloride; and suitable ethers include diethyl ether and anisole. A wide variety of single wafer or multiple wafer (batch) plasma systems can be used for this process; these systems include so called downstream ashers, such as the Gasonics L3510 photoresist asher, PECVD dielectric deposition systems such as the Applied Materials P5000, or reactive ion etch ("RIE") systems. Broadly, the conditions for the plasma process are within the following ranges: chamber temperature, 20° C. to 450° C.; RF power, 50 W to 1000 W; chamber pressure, 0.05 to 100 torr; plasma treatment time, 5 seconds to 5 minutes; and surface modification flow rate, 100-2000 sccm; inert gas flow rate (typically argon), 100-2000 sccm.

Preferably the overall process of is conducted within a cluster tool having a chamber adapted for each if the inventive steps, such as a chamber for depositing a silicate or organosilicate dielectric film on a substrate. A vapor, gas or chemical vapor deposition chamber, and means for transferring the film on substrate among the various chambers. The treatment in the chambers and the transferring among the chambers are preferably conducted while continuously maintaining vacuum conditions. Cluster tools for the processing of semiconductor wafers are well known in the art and are widely commercially available. Such may be exemplified by U.S. Pat. Nos. 5,259,881; 5,280,219; 5,730,801; 5,613,821 and 5,380,682.

Wafers are continuously maintained in an isolated environment at a constant vacuum pressure level, and transferred into and out of an external atmospheric pressure environment through one or more access ports or load-locks. In a typical system, a cassette or carrier with a series of wafers is placed at an interface port of the cluster tool and latches release the port door. A manipulator robot picks up the cassette or individual wafer and directs them to desired processing stations within the equipment. After processing, the reverse operation takes place. Such a wafer processing technique essentially eliminates contaminates since treatment takes place after the wafers are sealed in the internal vacuum environment, and they are not removed prior to completion of processing. The configuration achieves a significant improvement over the conventional handling of open cassettes inside a clean room. In addition, since the vacuum is not broken from step to step, the use of cluster tools increases process productivity and reduces defect levels. The use of a cluster tool significantly aids semiconductor processing throughput. As a result chemical vapor deposition and electron beam treatment can be done directly within a cluster tool without breaking vacuum or removal of the substrate from the cluster tool.

The artisan will appreciate that the invention is also contemplated to encompass microelectronic devices, such as semiconductor devices or ICs manufactured using these methods are also a part of the present invention.

The microelectronic devices, dielectric layers and materials may be utilized or incorporated into any suitable electronic component. Electronic components, as contemplated herein, are generally thought to comprise any dielectric component or layered dielectric component that can be utilized in an electronic-based product. Contemplated electronic components comprise circuit boards, chip packaging, dielectric components of circuit boards, printed-wiring boards, and other components of circuit boards, such as capacitors, inductors, and resistors.

Electronic-based products can be "finished" in the sense that they are ready to be used in industry or by other consumers. Examples of finished consumer products are a television, a computer, a cell phone, a pager, a palm-type organizer, a portable radio, a car stereo, and a remote control. Also contemplated are "intermediate" products such as circuit boards, chip packaging, and keyboards that are potentially utilized in finished products.

Electronic products may also comprise a prototype component, at any stage of development from conceptual model to final scale-up mock-up. A prototype may or may not contain all of the actual components intended in a finished product, and a prototype may have some components that are constructed out of composite material in order to negate their initial effects on other components while being initially tested. Electronic products and components may comprise layered materials, layered components, and components that are laminated in preparation for use in the component or product.

The following non-limiting examples serve to illustrate the invention.

EXAMPLE 1

System Configuration A

The configuration shown in FIG. 1 was used to perform a silylation treatment. A reservoir was filled with 100% dimethyldiacetoxysilane (DMDAS). Reservoir temperature is adjustable. A wafer with plasma damaged porous low-k (NANOGLASS-E, commercially available form Honeywell International, Sunnyvale, Calif.) was placed in the reaction chamber, evacuated for a 30 min dehydration step and during evacuation the film was heated to a desired temperature. The film was exposed to DMDAS vapor for desired time. The wafer was then removed from the reaction chamber and baked in N2 ambient on hot plates at 125° C., 200° C. and 350° C. for 1 minute each. The properties of the low-k film at different process steps are as follows. An increase in chamber process temperature increased % carbon repair and decreased dielectric constant. An increase in exposure time decreased carbon repair for lower temperature, but increased carbon repair for higher temperature process.

| Process Flow | Chamber Temp (C.) | Pumpdown Prior DMDAS Exposure (min) | DMDAS Exposure Time (min) | Contact Angle (NGE) Post 350 HP | % Carbon Restoration Post 350 HP | k(Hg) Post 350 HP |
|---|---|---|---|---|---|---|
| Post Cure | | | | >80 | | 2.22 |
| Damaged NGE | | | | <10 | | 2.85 |
| DMDAS Only | 45 | 30 | 1 | | 25 | 2.57 |
| DMDAS Only | 45 | 30 | 10 | | 10 | 2.58 |
| DMDAS Only | 150 | 30 | 1 | | 43 | 2.53 |
| DMDAS Only | 150 | 30 | 10 | | 65 | 2.54 |

EXAMPLE 2

System Configuration A

The configuration shown in FIG. 1 was used to perform a silylation treatment. A reservoir was filled with 100% DMDAS. The reservoir temperature is adjustable. A wafer with plasma damaged porous low-k (NANOGLASS-E) was placed in the reaction chamber, evacuated for a 30 min dehydration step and during evacuation the film was heated to a desired temperature. The film was exposed to DMDAS vapor for 1 min. Expose to NH$_3$ for 1 minute. The wafer was then removed from the reaction chamber and baked in N2 ambient on hot plates at 125° C., 200° C. and 350° C. for 1 min each. The properties of the low-k film at different process steps are as follows. An increase in chamber process temp with 1 minute exposure decreased % carbon repair, but decreased dielectric constant. The condition with increased exposure time and higher chamber temp gave decreased % carbon repair and decreased dielectric constant.

| Process Flow | Chamber Temp (C.) | Pumpdown Prior DMDAS Exposure (min) | DMDAS Exposure Time (min) | Contact Angle (NGE) Post 350 HP | % Carbon Restoration Post 350 HP | k(Hg) Post 350 HP |
|---|---|---|---|---|---|---|
| Post Cure | | | | >80 | | 2.22 |
| Damaged NGE | | | | <10 | | 2.85 |

-continued

| Process Flow | Chamber Temp (C.) | Pumpdown Prior DMDAS Exposure (min) | DMDAS Exposure Time (min) | Contact Angle (NGE) Post 350 HP | % Carbon Restoration Post 350 HP | k(Hg) Post 350 HP |
|---|---|---|---|---|---|---|
| DMDAS + NH3 | 45 | 30 | 1 | | 42 | 2.64 |
| DMDAS + NH3 | 45 | 30 | 10 | | 81 | 2.59 |
| DMDAS + NH3 | 150 | 30 | 1 | | 28 | 2.46 |
| DMDAS + NH3 | 150 | 30 | 10 | | 46 | 2.51 |

EXAMPLE 3

System Configuration B

The configuration shown in FIG. 2 was used to perform a silylation treatment. A bubbler was filled with 100% DMDAS and was maintained at a constant temperature of 45° C. Nitrogen was used to bubble through DMDAS and carry DMDAS through chamber at desired flow. A wafer with plasma damaged porous low-k (NANOGLASS-E) was placed in the furnace tube evacuated for 30 min dehydration step while being heated to a desired temperature. The film was exposed to DMDAS vapor for 30 minutes. A final anneal was performed in the furnace tube at a desired temperature. The wafer was then removed from furnace tube. The properties of the low-k film at different process steps are as follows. Varied chamber temperature conditions gave similar contact angle. The % carbon repair varied throughout temperature range. A dielectric constant of 2.29 was result for one temperature condition.

| Process Flow | Chamber Temp (C.) | Final Anneal (C.) | Pumpdown Prior DMDAS Exposure (min) | DMDAS Exposure Time (min) | Contact Angle (NGE) Post 350 HP | % Carbon Restoration Post 350 HP | k(Hg) Post 350 HP |
|---|---|---|---|---|---|---|---|
| Post Cure | | | | | >80 | | 2.22 |
| Damaged NGE | | | | | <10 | | 3.00 |
| DMDAS ONLY | 200 | 350 | 30 | 30 | 125 | 118 | |
| DMDAS ONLY | 200 | 350 | 30 | 30 | 108 | 94 | |
| DMDAS ONLY | 275 | 350 | 30 | 30 | 126 | 217 | |
| DMDAS ONLY | 275 | 350 | 30 | 30 | 116 | 72 | 2.29 |
| DMDAS ONLY | 350 | 425 | 30 | 30 | 125 | 49 | |
| DMDAS ONLY | 425 | 425 | 30 | 30 | 123 | 95 | |

EXAMPLE 4

System Configuration B

The configuration shown in FIG. 2 was used to perform a silylation treatment. A bubbler was filled with 100% DMDAS and was maintained at a constant temperature of 45° C. Nitrogen was used to bubble through DMDAS and carry DMDAS through furnace tube at a desired flow. A wafer with plasma damaged porous low-k (NANOGLASS-E) was placed in the furnace tube evacuated for 30 minutes dehydration step and heated to a desired chamber temperature. The film was exposed to NH$_3$ flow for 32 minutes. The film was exposed to DMDAS vapor for 30 minutes. A final anneal was performed in this tube at a desired temperature. The wafer was then removed from furnace tube. The properties of the low-k film at different process steps are as follows. Varied chamber temperature gave similar contact angles all >115 degrees. All samples gave >80% carbon repair and a decrease in dielectric constant from the damaged dielectric of 3.00.

| Process Flow | Chamber Temp (C.) | Final Anneal (C.) | Pumpdown Prior DMDAS Exposure (min) | DMDAS Exposure Time (min) | Contact Angle (NGE) Post 350 HP | % Carbon Restoration Post 350 HP | k(Hg) Post 350 HP |
|---|---|---|---|---|---|---|---|
| Post Cure | | | | | >80 | | 2.22 |
| Damaged NGE | | | | | <10 | | 3.00 |

-continued

| Process Flow | Chamber Temp (C.) | Final Anneal (C.) | Pumpdown Prior DMDAS Exposure (min) | DMDAS Exposure Time (min) | Contact Angle (NGE) Post 350 HP | % Carbon Restoration Post 350 HP | k(Hg) Post 350 HP |
|---|---|---|---|---|---|---|---|
| DMDAS + NH3 | 200 | 350 | 30 | 30 | 121 | 82 | 2.47 |
| DMDAS + NH3 | 275 | 350 | 30 | 30 | 123 | 245 | |
| DMDAS + NH3 | 350 | 350 | 30 | 30 | 115 | 165 | 2.33 |

EXAMPLE 5

System Configuration C

The configuration shown in FIG. 3 was used to perform a silylation treatment. A jacketed reservoir was filled with 100% DMDAS and maintained at 55° C. A wafer with plasma damaged porous low-k (NANOGLASS-E) was placed in the reaction chamber, evacuated for a dehydration step and heated to a desired chamber temperature. The plasma damaged porous low-k film was exposed to DMDAS vapor for 5 minutes. The film was then removed from the reaction chamber and baked in $N_2$ ambient on hot plates at 125° C., 200° C. and 350° C. for 1 minute each. The properties of the low-k film at different process steps are as follows. An increase in dehydration step for the 110° C. condition gave an increase in contact angle, increase in carbon repair and a decrease in dielectric constant. Dehydration step of the 300° C. chamber process temperature had little effect on contact angle, % carbon repair and dielectric constant. Overall higher chamber temperature processing gave better results.

| Process Flow | Chamber Temp (C.) | Pumpdown Prior DMDAS Exposure | Contact Angle (NGE) Post 350 HP | % Carbon Restoration Post 350 HP | k(Hg) Post 350 HP |
|---|---|---|---|---|---|
| Post Cure | | | >80 | | 2.22 |
| Damaged NGE | | | <10 | | 3.00 |
| DMDAS Only | 110 | 10 | 97 | 14 | 2.56 |
| DMDAS Only | 110 | 900 | 103 | 24 | 2.53 |
| DMDAS Only | 300 | 10 | 84 | 30 | 2.45 |
| DMDAS Only | 300 | 900 | 87 | 31 | 2.47 |

EXAMPLE 6

System Configuration C

The configuration shown in FIG. 3 was used to perform a silylation treatment. A jacketed reservoir was filled with 100% DMDAS and maintained at 55° C. A wafer with plasma damaged porous low-k (NANOGLASS-E) was placed in the reaction chamber, evacuated for a dehydration step and heated to a desired chamber temperature. The plasma damaged porous low-k film was exposed to $NH_3$ gas for 5 min. After 5 minutes $NH_3$ gas exposure while $NH_3$ is flowing chamber is opened up to DMDAS gas. The film was then removed from the reaction chamber and baked in N2 ambient on hot plates at 125° C., 200° C. and 350° C. for 1 minute each. The properties of the low-k film at different process steps are as follows. The dehydration step prior to introduction of $NH_3$ had little effect on final results within a given temperature range. This could be the result of in the presence of $NH_3$ and/or increased dehydration step during the $NH_3$ step. Increased chamber temperature gave decreased contact angle, increased carbon repair and decreased dielectric constant.

| Process Flow | Chamber Temp (C.) | Pumpdown Prior to Exposure to NH3 | Contact Angle (NGE) Post 350 HP | % Carbon Restoration Post 350 HP | k(Hg) Post 350 HP |
|---|---|---|---|---|---|
| Post Cure | | | >80 | | 2.22 |
| Damaged NGE | | | <10 | | 3.00 |
| NH3 + DMDAS | 110 | 10 | 114 | 32 | 2.45 |

-continued

| Process Flow | Chamber Temp (C.) | Pumpdown Prior to Exposure to NH3 | Contact Angle (NGE) Post 350 HP | % Carbon Restoration Post 350 HP | k(Hg) Post 350 HP |
|---|---|---|---|---|---|
| NH3 + DMDAS | 110 | 900 | 114 | 25 | 2.46 |
| NH3 + DMDAS | 300 | 10 | 86 | 39 | 2.40 |
| NH3 + DMDAS | 300 | 900 | 85 | 45 | 2.40 |

EXAMPLE 7

System Configuration C

The configuration shown in FIG. 3 was used to perform a silylation treatment. A jacketed reservoir was filled with 100% DMDAS and maintained at 55° C. A wafer with plasma damaged porous low-k (NANOGLASS-E) was placed in the reaction chamber and heated to a desired chamber temperature. A desired pumpdown (degas) step prior to gas exposure. The film was exposed to $NH_3$ gas for 5 minutes The chamber was evacuated for 10 sec and than the chamber is opened up to DMDAS gas for 5 minutes. The wafer was then removed from the reaction chamber and baked in $N_2$ ambient on hot plates at 125° C., 200° C. and 350° C. for 1 minute each. The properties of the low-k film at different process steps are as follows. The dehydration step prior to introduction of $NH_3$ had little effect on final results within a given temperature range. This could be the result of in the presence of $NH_3$ and/or increased dehydration step during the $NH_3$ step. Increased chamber temperature gave decreased contact angle, increased carbon repair and decreased dielectric constant.

| Process Flow | Chamber Temp (C.) | Pumpdown Prior to Exposure to NH3 | Contact Angle (NGE) Post 350 HP | % Carbon Restoration Post 350 HP | k(Hg) Post 350 HP |
|---|---|---|---|---|---|
| Post Cure | | | >80 | | 2.22 |
| Damaged NGE | | | <10 | | 3.00 |
| NH3 + pumpdown + DMDAS | 110 | 10 | 102 | 17 | 2.53 |
| NH3 + pumpdown + DMDAS | 110 | 900 | 104 | 22 | 2.53 |
| NH3 + pumpdown + DMDAS | 300 | 10 | 85 | 25 | 2.48 |
| NH3 + pumpdown + DMDAS | 300 | 900 | 86 | 45 | 2.48 |

EXAMPLE 8

System Configuration A

The configuration shown in FIG. 1 was used to perform a silylation treatment. A reservoir was filled with 100% Hexamethylcyclotrisilazane (HMCTZ). Reservoir temperature is adjustable. This study maintained reservoir temp of 45° C. A wafer with plasma damaged porous low-k (NANOGLASS-E) was placed in the reaction chamber, evacuated for 30 min and during evacuation the film was heated to a desired temperature chamber temperature. The film was exposed to HMCTZ vapor for 1. The wafer was then removed from the reaction chamber and baked in N2 ambient on hot plates at 125° C., 200° C. and 350° C. for 1 minute each. The properties of the low-k film at different process steps are as follows. Using HMCTZ for repair of lowered the dielectric constant from 2.92 to 2.45.

| Process Flow | Chamber Temp (C.) | Pumpdown Prior to Exposure to HMCTZ | Contact Angle (NGE) Post 350 HP | % Carbon Restoration Post 350 HP | k(Hg) Post 350 HP |
|---|---|---|---|---|---|
| Post Cure | | | >80 | | 2.22 |
| Damaged NGE | | | <10 | | 2.92 |
| HMCTZ | 150 | 30 | | | 2.46 |
| HMCTZ | 150 | 30 | | | 2.45 |

EXAMPLE 9

In order to understand the temperature dependence of the silanization reaction on the surface, the deposition temperature was varied from 110° C. to 400° C. The different temperature would result in variation in moisture content and gas molecular activity on the surface, which in turn, result in different chemistry to occur. Process conditions used: ammonia flow rate 20 sccm (or 80 sccm), DMDAS reservoir temperature, 55° C., total pressure 1.5 torr, bake at 350° C. oven

| Substrate temperature, ° C. | Contact angle | Dielectric constant | Carbon restoration |
|---|---|---|---|
| 200, 6, (7) | 78, (83) | 2.67, (2.60) | |
| 300, 8, (9) | 102 (57) | 2.54, (2.64) | 20 (12) |
| 400, 13, (12) | 84, (85) | 2.52, (2.47) | 31 (14) |

The higher the temperature, the lower the K value.

EXAMPLE 10

In order to understand the effect of gas dose on the silanization reaction, a flow rate of the silane gas was varied. Flow rate was calculated by changing reservoir temperature of the silane solution and a pressure in the chamber. The reservoir temperature was varied by heating the reactant solution in a pyrex container. Process conditions used: ammonia flow rate 80 sccm, total pressure 1.5 torr, bake at 350° C. oven, wafer temperature, 400° C.

| Gas flow rate, sccm | Contact angle | Dielectric constant | Carbon restoration | Defect count (defect density) |
|---|---|---|---|---|
| 65, 4 | 89 | 2.46 | 24 | |
| 55, 12 | 85 | 2.47 | 27 | |

No difference in K value by varying reservoir temperature

EXAMPLE 11

In order to understand the effect of gas dose on the silanization reaction, a flow rate of the ammonia gas was varied. The reservoir temperature was varied by heating the reactant solution in a pyrex container. Process conditions used: total pressure 1.5 torr, bake at 350° C. oven, wafer temperature, 400° C., DMDAS reservoir 55° C.

| Gas flow rate, sccm | Contact angle | Dielectric constant | Carbon restoration |
|---|---|---|---|
| 20, 13 | 84 | 2.52 | 32 |
| 80, 12 | 85 | 2.47 | 27 |

The higher the ammonia gas flow rate, the lower the K value.

EXAMPLE 12

To understand the effect of bake condition (in-situ and oven) on K value, the processed wafers were baked in either the chamber (in-situ) or TEL oven. Process conditions used: ammonia flow rate 50 sccm, total pressure 2.0 torr, wafer temperature, 300° C., Reservoir temperature 55° C.

| Bake condition | Contact Angle | Dielectric constant | Carbon restoration | Defect count (defect density) |
|---|---|---|---|---|
| Chamber, 12 | 86 | 2.47 | 72 | |
| TEL HP, 12 | 88 | 2.45 | 86 | |

Slight decrease in contact angle and carbon restoration using P5000 for final thermal treatment compared to TEL HP. Slight increase in dielectric constant using P5000 instead of TEL HP.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A method for treating a silicate or organosilicate dielectric film on a substrate, which silicate or organosilicate dielectric film either comprises silanol moieties or which silicate or organosilicate dielectric film has had at least some previously present carbon containing moieties removed therefrom, the method comprising:
   (a) optionally dehydrating at least a portion of a silicate or organosilicate dielectric film on a substrate; then
   (b) optionally applying an activating agent for a surface modification agent composition to the silicate or organosilicate dielectric film; then
   (c) contacting the silicate or organosilicate dielectric film with a surface modification agent composition in a vapor or gaseous state, wherein the surface modification agent composition comprises a component capable of alkylating or arylating silanol moieties or bonds created by removal of carbon containing moieties from the silicate or organosilicate dielectric film via silylation; wherein the surface modification agent composition comprises at least one compound having a formula selected from the group consisting of $[-SiR_2NR'-]_n$ where n>2 and may be cyclic; $R_3SiNR'SiR_3$, $(R_3Si)_3N$; $R_3SiNR'_2$; $R_2Si(NR'_2)_2$; $RSi(NR'_2)_3$; $R_xSi[OC(R')=R'']_{4-x}$, $R_xSi(NCOR_2)_{4-x}$, $R_xSi(NCO)_{4-x}$, $R_xSi(OH_2)_{4-x}$, and combinations thereof, wherein x is an integer ranging from 1 to 3, each R is independently selected from hydrogen and a hydrophobic organic moiety; R' is hydrogen, or an organic moiety, and R" is an alkyl or carbonyl group; and wherein the surface modification agent composition further comprises an activating agent selected from the group consisting of ammonium compounds, phosphonium compounds, sulfonium compounds, iodonium compounds, alkyl amines, aryl amines, alcohol amines, primary amines, secondary amines, tertiary amines, ammonia, quaternary ammonium salts, tetramethylammonium acetate, tetrabutylammonium acetate, a combinations of tetramethylammonium acetate and tetrabutylammonium acetate, sodium hydroxide, potassium hydroxide lithium hydroxide and ammonium hydroxide; said contacting being conducted under conditions sufficient to (i) or (ii) or (iii):
   (i) add carbon containing moieties to the silicate or organosilicate dielectric film, or (ii) seal surface pores of the silicate or organosilicate dielectric film, when the film is porous; or (iii) where the film is porous, first add carbon containing moieties to the silicate or organosilicate dielectric film, and then subsequently seal surface pores of the silicate or organosilicate dielectric film.

2. A method of preventing voids in a damaged silicate or organosilicate dielectric film on a substrate, which silicate or organosilicate dielectric film either comprises silanol moieties or which silicate or organosilicate dielectric film has had at least some previously present carbon containing moieties removed therefrom, the method comprising:

(a) optionally dehydrating at least a portion of a silicate or organosilicate dielectric film on a substrate; then (b) applying an activating agent for a surface modification agent composition to the silicate or organosilicate dielectric film by chemical vapor deposition, which activating agent is selected from the group consisting of an amine, an onium compound, an alkali metal hydroxide, an acid, and combinations thereof; then (c) contacting the silicate or organosilicate dielectric film with a surface modification agent composition by chemical vapor deposition of the surface modification agent composition to the silicate or organosilicate dielectric film, wherein the surface modification agent composition comprises a component capable of alkylating or arylating silanol moieties or bonds created by removal of carbon containing moieties from the silicate or organosilicate dielectric film via silylation; said contacting being conducted under conditions sufficient to either seal surface pores of the silicate or organosilicate dielectric film, when the film is porous; or where the film is porous, first add carbon containing moieties to the silicate or organosilicate dielectric film, and then subsequently seal surface pores of the silicate or organosilicate dielectric film.

3. The method of claim 1 wherein step (a) is conducted.

4. The method of claim 1 wherein step (b) is conducted.

5. The method of claim 1 wherein step (b) is conducted by chemical vapor deposition.

6. The method of claim 1 wherein both step (a) and step (b) are conducted.

7. The method of claim 1 wherein step (c) is conducted by chemical vapor deposition.

8. The method of claim 1 wherein step (c) is conducted under conditions sufficient to add carbon containing moieties to the silicate or organosilicate dielectric film.

9. The method of claim 1 wherein step (c) is conducted under conditions sufficient to seal surface pores of the silicate or organosilicate dielectric film when such film is porous.

10. The method of claim 1 wherein step (c) is conducted under conditions sufficient to first add carbon containing moieties to the silicate or organosilicate dielectric film, and then seal surface pores of the silicate or organosilicate dielectric film when such film is porous.

11. The method of claim 1 wherein the film is an organosilicate dielectric film which has been has been previously subjected to at least one treatment which removes at least a portion of previously existing carbon containing moieties from the organosilicate dielectric film.

12. The method of claim 1 wherein the silicate or organosilicate dielectric film has been previously subjected to at least one treatment selected from the group consisting of chemical exposure, plasma exposure, thermal treatment, vacuum treatment, ionizing radiation exposure, electron beam exposure, UV exposure, etching, ashing, wet cleaning, plasma enhanced chemical vapor deposition, supercritical fluid exposure and combinations thereof, which at least one treatment removes at least a portion of previously existing carbon containing moieties from the silicate or organosilicate dielectric film.

13. The method of claim 1 wherein the silicate or organosilicate dielectric film has been previously treated to remove from about 5 to about 95% of previously existing carbon containing moieties; and step (c) is conducted to add carbon containing moieties to the silicate or organosilicate dielectric film.

14. The method of claim 1 wherein the silicate or organosilicate dielectric film comprises interconnected pores and wherein step (c)(i) or step (c)(iii) is conducted under conditions sufficient to add carbon containing moieties to the silicate or organosilicate dielectric film through a depth thereof such that at least 10% of the silanol moieties or bonds created by removal of carbon containing moieties from the silicate or organosilicate dielectric film are silylated.

15. The method of claim 1 wherein the silicate or organosilicate dielectric film has pores and step (c) is conducted under conditions sufficient to seal pores at a surface of the organosilicate dielectric film to a depth of about 50 Å or less.

16. The method of claim 1 wherein the silicate or organosilicate dielectric film has pores and step (c) is conducted under conditions sufficient to seal pores at a surface of the silicate or organosilicate dielectric film, to an extent that a subsequent exposure to (i) precursors for chemical vapor deposition of nitride, carbide, metals, or (ii) non-etching wet cleaning materials does not allow a penetration thereof to a depth greater than 5 times the maximum pore size.

17. The method of claim 1 further comprising the subsequent step (d), after step (c) of subjecting the silicate or organosilicate dielectric film to a treatment sufficient to effect (i) an increased addition of carbon containing moieties to the silicate or organosilicate dielectric film or (ii) an increased sealing of surface pores of the silicate or organosilicate dielectric film; or (iii) first an increased addition of carbon containing moieties to the silicate or organosilicate dielectric film and then an increased sealing of surface pores of the silicate or organosilicate dielectric film or (iv) removing at least some residual activating agent, surface modification agent, by-products; and combinations thereof.

18. The method of claim 17 wherein step (d) is conducted by heating, ultraviolet radiation, plasma energy, electron beam, ion beam or combinations thereof.

19. The method of claim 1 wherein step (c) is conducted at a temperature of from about 0° C. to about 450° C. for from about 1 second to about 2 hours.

20. The method of claim 2 wherein the surface modification agent composition further comprises at least one compound having a formula selected from the group consisting of acetoxytrimethylsilane, acetoxysilane, diacetoxysilane, triacetoxysilane, diacetoxydimethylsilarie, dimethyldiacetoxysilane, methyltriacetoxysilane, phenyltriacetoxysilane, diphenyldiacetoxysilane, methyltriethoxysilane, dimethyldiethoxysilane, trimethylethoxysilane, methyltrimethoxysilane, dimethyldimethoxysilane, trimethylmethoxysilane, methyltrichlorosilane, dimethyldichlorosilane, trimethyichiorosilane, methylsilane, dimethylsilane, trimethylsilane, hexamethyldisilazane, 2-trimethylsiloxypent-2-ene-4-one, n-(trimethylsilyl)acetamide, 2-(trimethylsilyl) acetic acid, n-(trimethylsilyl)imidazole, trimethylsilyipropiolate, trimethylsilyl(trimethylsiloxy)-acetate, nonamethyltrisilazane, hexamethyldisiloxane, trimethylsilanol, triethylsilanol, triphenylsilanol, t-butyldimethylsilanol, diphenylsilanediol, trimethoxysilane, triethoxysilane, trichlorosilane, hexamethylcyclotrisilazane, bisdimethylaminodimethylsilane, bisdiethylaminodimethylsilane, tris(dimethylamino)methylsilane, tris(dimethylamino)phenylsilane, tris(dimethylamino)silane, dimethylsilyldiformamide, dimethylsilyldiacetamide, dimethylsilyldiisocyante, trimethylsilylisocyanate, methylsilyltriisocyanate and combinations thereof.

21. The method of claim 1 wherein the surface modification agent composition further comprises a corrosion inhibitor.

22. The method of claim 2 wherein the surface modification agent composition contains said activating agent, wherein the surface modification agent composition comprises a combination of the activating agent and a component capable of alkylating or arylating silanol moieties or bonds created by removal of carbon containing moieties from the silicate or organosilicate dielectric film via silylation.

23. The method of claim 2 wherein said contacting the silicate or organosilicate dielectric film with a surface modification agent composition imparts hydrophobic properties to the silicate or organosilicate dielectric film.

24. The method of claim 2 wherein said contacting the silicate or organosilicate dielectric film with a surface modification agent composition is conducted under conditions sufficient either seal surface pores of the silicate or organosilicate dielectric film, when the film is porous; or where the film is porous, first add carbon containing moieties to the silicate or organosilicate dielectric film, and then subsequently seal surface pores of the silicate or organosilicate dielectric film through at least a portion of a depth thereof such that at least 10% of the silanol moieties or bonds created by removal of carbon containing moieties from the silicate or organosilicate dielectric film are silylated, and then subsequently seal surface pores of the silicate or organosilicate dielectric film to a depth of about 50 Å or less.

25. The method of claim 2 wherein step (a) is conducted.

26. The method of claim 2 wherein step (c) is conducted under conditions sufficient to add carbon containing moieties to the silicate or organosilicate dielectric film.

27. The method of claim 2 wherein step (c) is conducted under conditions sufficient to seal surface pores of the silicate or organoslilicate dielectric film when such film is porous.

28. The method of claim 2 wherein step (c) is conducted under conditions sufficient to first add carbon containing moieties to the silicate or organosilicate dielectric film, and then seal surface pores of the silicate or organosilicate dielectric film when such film is porous.

29. The method of claim 2 wherein the film is an organosilicate dielectric film which has been has been previously subjected to at least one treatment which removes at least a portion of previously existing carbon containing moieties from the organosilicate dielectric film.

30. The method of claim 2 wherein the silicate or organosilicate dielectric film has been previously subjected to at least one treatment selected from the group consisting of chemical exposure, plasma exposure, thermal treatment, vacuum treatment, ionizing radiation exposure, electron beam exposure, UV exposure, etching, ashing, wet cleaning, plasma enhanced chemical vapor deposition, supercritical fluid exposure and combinations thereof, which at least one treatment removes at least a portion of previously existing carbon containing moieties from the silicate or organosilicate dielectric film.

31. The method of claim 2 wherein the silicate or organosilicate dielectric film has been previously treated to remove from about 5 to about 95% of previously existing carbon containing moieties; and step (c) is conducted to add carbon containing moieties to the silicate or organosilicate dielectric film.

32. The method of claim 2 wherein the silicate or organosilicate dielectric film has pores and step (c) is conducted under conditions sufficient to seal pores at a surface of the organosilicate dielectric film to a depth of about 50 Å or less.

33. The method of claim 2 wherein the silicate or organosilicate dielectric film has pores and step (c) is conducted under conditions sufficient to seal pores at a surface of the silicate or organosilicate dielectric film, to an extent that a subsequent exposure to (i) precursors for chemical vapor deposition of nitride, carbide, metals, or (ii) non-etching wet cleaning materials does not allow a penetration thereof to a depth greater than 5 times the maximum pore size.

34. The method of claim 2 further comprising the subsequent step (d), after step (c) of subjecting the silicate or organosilicate dielectric film to a treatment sufficient to effect (i) an increased addition of carbon containing moieties to the silicate or organosilicate dielectric film or (ii) an increased sealing of surface pores of the silicate or organosilicate dielectric film; or (iii) first an increased addition of carbon containing moieties to the silicate or organosilicate dielectric film and then an increased sealing of surface pores of the silicate or organosilicate dielectric film or (iv) removing at least some residual activating agent, surface modification agent, by-products; and combinations thereof.

35. The method of claim 2 wherein the surface modification agent composition further comprises a corrosion inhibitor.

36. The method of claim 2 wherein step (c) is conducted at a temperature of from about 0° C. to about 450° C. for from about 1 second to about 2 hours.

* * * * *